US009506836B2

(12) United States Patent (10) Patent No.: US 9,506,836 B2
Pado et al. (45) Date of Patent: Nov. 29, 2016

(54) METHODS AND SYSTEMS FOR STRUCTURAL HEALTH MONITORING

(71) Applicant: The Boeing Company, Seal Beach, CA (US)

(72) Inventors: Lawrence Eric Pado, St. Charles, MO (US); Jeong-Beom Ihn, Bellevue, WA (US)

(73) Assignee: The Boeing Company, Chicago, IL (US)

( * ) Notice: Subject to any disclaimer, the term of this patent is extended or adjusted under 35 U.S.C. 154(b) by 887 days.

(21) Appl. No.: 13/647,935

(22) Filed: Oct. 9, 2012

(65) Prior Publication Data

US 2014/0100832 A1 Apr. 10, 2014

(51) Int. Cl.
*G01M 5/00* (2006.01)
(52) U.S. Cl.
CPC .......... *G01M 5/0033* (2013.01); *G01M 5/0066* (2013.01)
(58) Field of Classification Search
CPC .................. G01M 5/0033; G01M 5/0066
See application file for complete search history.

(56) References Cited

U.S. PATENT DOCUMENTS

| 6,006,163 | A | 12/1999 | Lichtenwalner et al. |
| 8,055,455 | B2 | 11/2011 | Ihn et al. |
| 2006/0287842 | A1 | 12/2006 | Kim |
| 2009/0192729 | A1* | 7/2009 | Pado ............... G01N 29/043 702/36 |

FOREIGN PATENT DOCUMENTS

EP 2078943 A2 7/2009

OTHER PUBLICATIONS

Lu, Yinghui, et al., "A Methodology for Structural Health Monitoring With Diffuse Ultrasonic Waves in the presence of Temperature Variations," Ultrasonics, 43 (2005) pp. 717-731.

(Continued)

*Primary Examiner* — Janet Suglo
(74) *Attorney, Agent, or Firm* — Armstrong Teasdale LLP

(57) ABSTRACT

Methods and apparatus for structural health monitoring are described. In one example, a method for use in designing a structural health monitoring (SHM) system for use in monitoring a host structure is described. The method includes one or more of a process for designing SHM systems for any given piece of structural hardware, a process for evaluating a given SHM system, a method to quantify the performance of a given SHM system in comparison to current inspection processes, a finite element modeling approach to determining excitation frequencies to detect damage and for selecting the best time window to use for sensed excitation signals, a Bayesian Network based data fusion technique that fuses in environmental information (load cycles induced on the structure) with a damage index (DI) to produce crack detection and estimation of crack length, and a damage location and sensor selection technique.

20 Claims, 22 Drawing Sheets

(56) References Cited

OTHER PUBLICATIONS

Lu, Yinghui, et al., "Feature Extraction and Sensor Fusion for Ultrasonic Structural Health Monitorina Under Changing Environmental Conditions," IEEE Sensors Journal, vol. 9, No. 11, Nov. 2009, pp. 1462-1471.

Department of Defense Handbook, "Nondestructive Evaluation System Reliability Assessment," Apr. 14, 2001.

EP Partial Search Report for related application 13187946.2 dated Jul. 25, 2016; 7 pp.

Gorinevsky, Dimitry et al.; "Optimal Estimation of Accumulating Damage Trend from a Series of SHM Images"; International Workshop on Structural Health Monitoring; Stanford, CA; Sep. 2007; 7 pp.

Derriso, M.M. et al.; "Efficient Airframe Management Using In-Situ Structural Health Monitoring"; 6th European Workshop on Structural Health Monitoring; Dresden, Germany; Jul. 3-6, 2012; 8 pp.

\* cited by examiner

| LoadCycles | | |
|---|---|---|
| 0 to 1.64 | 1.99 | ▬ |
| 1.64 to 3.28 | 2.00 | ▬ |
| 3.28 to 4.92 | 2.00 | ▬ |
| 4.92 to 6.56 | 2.00 | ▬ |
| 6.56 to 8.2 | 2.00 | ▬ |
| 8.2 to 9.84 | 2.00 | ▬ |
| 9.84 to 11.48 | 2.00 | ▬ |
| 11.48 to 13.12 | 2.00 | ▬ |
| 13.12 to 14.76 | 2.00 | ▬ |
| 14.76 to 16.4 | 2.00 | ▬ |
| 16.4 to 18.04 | 2.00 | ▬ |
| 18.04 to 19.68 | 2.00 | ▬ |
| 19.68 to 21.32 | 2.00 | ▬ |
| 21.32 to 22.96 | 2.00 | ▬ |
| 22.96 to 24.6 | 2.00 | ▬ |
| 24.6 to 26.24 | 2.00 | ▬ |
| 26.24 to 27.88 | 2.00 | ▬ |
| 27.88 to 29.52 | 2.00 | ▬ |
| 29.52 to 31.16 | 2.00 | ▬ |
| 31.16 to 32.8 | 2.00 | ▬ |
| 32.8 to 34.44 | 2.00 | ▬ |
| 34.44 to 36.08 | 2.00 | ▬ |
| 36.08 to 37.72 | 2.00 | ▬ |
| 37.72 to 39.36 | 2.00 | ▬ |
| 39.36 to 41 | 2.00 | ▬ |
| 41 to 42.64 | 2.00 | ▬ |
| 42.64 to 44.28 | 2.00 | ▬ |
| 44.28 to 45.92 | 2.00 | ▬ |
| 45.92 to 47.56 | 2.00 | ▬ |
| 47.56 to 49.2 | 2.00 | ▬ |
| 49.2 to 50.84 | 2.00 | ▬ |
| 50.84 to 52.48 | 2.00 | ▬ |
| 52.48 to 54.12 | 2.00 | ▬ |
| 54.12 to 55.76 | 2.00 | ▬ |
| 55.76 to 57.4 | 2.00 | ▬ |
| 57.4 to 59.04 | 2.00 | ▬ |
| 59.04 to 60.68 | 2.00 | ▬ |
| 60.68 to 62.32 | 2.00 | ▬ |
| 62.32 to 63.96 | 2.00 | ▬ |
| 63.96 to 65.6 | 2.00 | ▬ |
| 65.6 to 67.24 | 2.00 | ▬ |
| 67.24 to 68.88 | 2.00 | ▬ |
| 68.88 to 70.52 | 2.00 | ▬ |
| 70.52 to 72.16 | 2.00 | ▬ |
| 72.16 to 73.8 | 2.00 | ▬ |
| 73.8 to 75.44 | 2.00 | ▬ |
| 75.44 to 77.08 | 2.00 | ▬ |
| 77.08 to 78.72 | 2.00 | ▬ |
| 78.72 to 80.36 | 2.00 | ▬ |
| 80.36 to 82 | 2.01 | ▬ |
| 41 ± 24 | | |

FIG. 15

| In_DI | |
|---|---|
| -5 to -4.89 | 0 |
| -4.89 to -4.78 | 0 |
| -4.78 to -4.67 | 0 |
| -4.67 to -4.56 | 0 |
| -4.56 to -4.45 | 0 |
| -4.45 to -4.34 | 0 |
| -4.34 to -4.23 | 0 |
| -4.23 to -4.12 | 0 |
| -4.12 to -4.01 | 0 |
| -4.01 to -3.9 | 0 + |
| -3.9 to -3.79 | 0 + |
| -3.79 to -3.68 | 0 + |
| -3.68 to -3.57 | 0 + |
| -3.57 to -3.46 | 0 + |
| -3.46 to -3.35 | 0 + |
| -3.35 to -3.24 | 0 + |
| -3.24 to -3.13 | 0 + |
| -3.13 to -3.02 | 0 + |
| -3.02 to -2.91 | 0 + |
| -2.91 to -2.8 | 0 + |
| -2.8 to -2.69 | 0 + |
| -2.69 to -2.58 | .001 |
| -2.58 to -2.47 | .005 |
| -2.47 to -2.36 | .019 |
| -2.36 to -2.25 | .062 |
| -2.25 to -2.14 | 0.18 |
| -2.14 to -2.03 | 0.45 |
| -2.03 to -1.92 | 1.02 |
| -1.92 to -1.81 | 2.07 |
| -1.81 to -1.7 | 3.75 |
| -1.7 to -1.59 | 6.06 |
| -1.59 to -1.48 | 8.76 |
| -1.48 to -1.37 | 11.3 |
| -1.37 to -1.26 | 13.0 |
| -1.26 to -1.15 | 13.4 |
| -1.15 to -1.04 | 12.3 |
| -1.04 to -0.93 | 10.1 |
| -0.93 to -0.82 | 7.37 |
| -0.82 to -0.71 | 4.82 |
| -0.71 to -0.6 | 2.81 |
| -0.6 to -0.49 | 1.47 |
| -0.49 to -0.38 | 0.68 |
| -0.38 to -0.27 | 0.28 |
| -0.27 to -0.16 | 0.11 |
| -0.16 to -0.05 | .035 |
| -0.05 to -0.06 | .010 |
| 0.06 to 0.17 | .003 |
| 0.17 to 0.28 | 0 + |
| 0.28 to 0.39 | 0 + |
| 0.39 to 0.5 | 0 + |
| -1.23 ± 0.33 | |

FIG. 20

METHODS AND SYSTEMS FOR STRUCTURAL HEALTH MONITORING

BACKGROUND

The field of the disclosure relates generally to structural health monitoring, and more particularly relates to methods and systems for aircraft structural health monitoring.

Some structural health monitoring (SHM) systems can be used to monitor an aircraft structure. One example SHM system is formed using an array of piezoelectric transducers (PZTs) bonded to a structure. Each PZT, acting one at a time, broadcasts a vibration signal and all other PZTs bonded to the structure record the signal as received at their location. Such an interrogation is performed when the structure is at a known, good state and the received signals are recorded and saved as reference signals. When, at some future time, the structure is interrogated again, the newly received signals are compared to the reference signals. Any differences found between the reference signals and the new signals may indicate damage to the structure and/or correlate to the magnitude of damage to the structure. The differences between the reference signals and the new signals are generally reduced to a single number called a Damage Index (DI), with larger values indicating more damage.

Some known systems use broadband excitation and use differences in a signal transfer function to calculate a DI. Damage is localized by noting the location of the actuator with the highest magnitude DI, identifying the three adjacent transducers with the greatest sum of DIs, and then using center of mass equations to locate damage. Finally, the system produces a qualitative, but not quantitative, characterization of damage.

BRIEF DESCRIPTION

According to one aspect of the present disclosure, A method for use in designing a structural health monitoring (SHM) system for use in monitoring a host structure is described. The SHM system includes at least one actuator and at least one sensor. The method includes creating a first model of the SHM system using a finite element model (FEM), creating a second model of the SHM system using a FEM, simulating signal propagation and response of the first model and the second model for a first frequency range including a plurality of excitation frequencies, and determining, based at least in part on the simulating, a second frequency range within the first frequency range in which the simulated response of the SHM system exhibits a relatively high correlation with the structural damage. The first model includes structural damage and the second model does not include the structural damage.

Another aspect of the present disclosure is a method for use in designing a structural health monitoring (SHM) system for use in monitoring a host structure that may be susceptible to damage. The damage has a damage characteristic influenced, at least in part, by an aging factor. The SHM system includes at least one actuator and at least one sensor. The method includes determining a plurality of damage index (DI) values based, at least in part, on data acquired by testing the SHM system on at least one sample host structure, defining an aging factor node representing possible values of an aging factor of the host structure, defining a damage characteristic node having discretized states representing possible values that the damage characteristic may take, determining a probability of each value of the damage characteristic as a function of the aging factor, defining a DI node having discretized values representing possible values of the DI, and combining the aging factor node, the damage characteristic node, and the DI node into a Bayesian network.

Yet another aspect of the present disclosure is a structural health monitoring (SHM) system for use in monitoring a host structure that may be susceptible to damage. The damage has a damage characteristic influenced, at least in part, by an aging factor. The SHM system includes at least one actuator configured to couple to the host structure and propagate a signal through the host structure, at least one sensor configured to couple to the host structure and generate at least one signal in response to the signal propagated through the host structure by said at least one actuator, and a controller coupled to said at least one actuator and said at least one sensor. The controller is configured to receive the at least one signal from the at least one sensor, calculate a damage index (DI) based, at least in part, on the at least one signal, and input the calculated DI to a Bayesian network configured to output an expected value of the damage characteristic.

BRIEF DESCRIPTION OF THE DRAWINGS

FIG. 15 illustrates a loads node developed as part of the method shown in FIG. 14.

FIG. 20 is a Damage Index Node with a completed conditional probability table for use as part of the method shown in FIG. 1.

DETAILED DESCRIPTION

Figure 1:
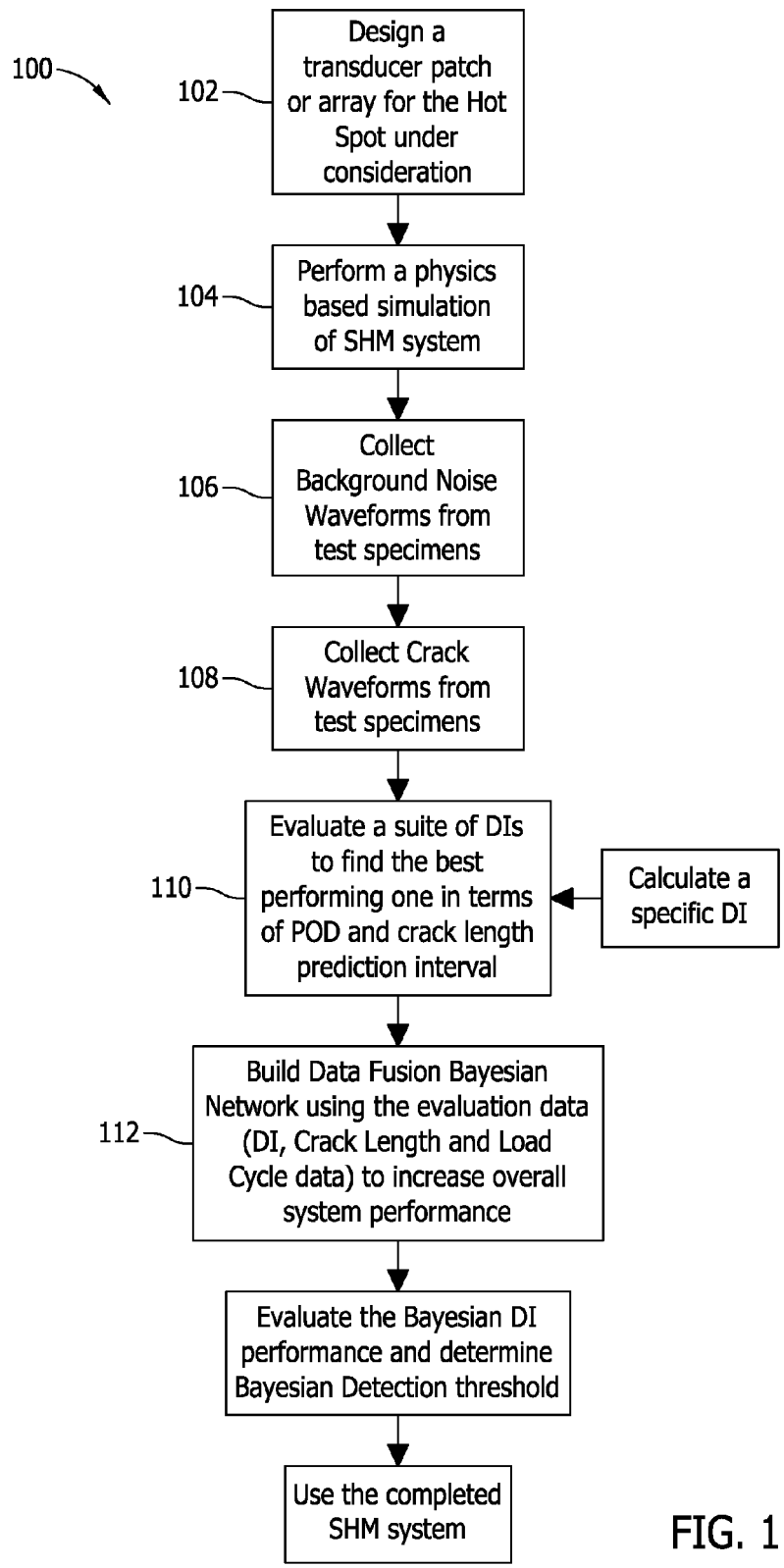
FIG. 1 is a flowchart of an exemplary method for use in designing a structural health monitoring (SHM) system.

As used herein, an element or step recited in the singular and proceeded with the word "a" or "an" should be understood as not excluding plural elements or steps unless such exclusion is explicitly recited. Furthermore, references to "one embodiment" of the present invention or the "exemplary embodiment" are not intended to be interpreted as excluding the existence of additional embodiments that also incorporate the recited features.

The exemplary methods and systems described herein relate to structural health monitoring (SHM). More particularly the exemplary embodiments provide methods and systems for aircraft structural health monitoring and development of SHM systems. In general, the embodiments described herein provide a step by step process for designing SHM systems for any given piece of structural hardware, a rigorous process for evaluating a given SHM system, a method to quantify the performance of a given SHM system in comparison to current inspection processes, a finite element modeling approach to determining excitation frequencies to detect damage and for selecting the best time window to use for sensed excitation signals, a Bayesian Network based data fusion technique that fuses in environmental information (load cycles induced on the structure) with a damage index (DI) to produce crack detection and estimation of crack length better than either source of information can produce alone, a new damage location and sensor selection technique, and/or an exemplar system designed by this process. Although the methods and systems are described herein with reference to aircraft, they may be applied to any platform for which SHM as described herein is appropriate.

The methods and systems described herein provide an on-board SHM system that is operable to detect a crack within a specified region within an aircraft structure, locate the crack within that region, and indicate the length of the crack. Some embodiments of this disclosure describe a prescribed series of steps needed to turn raw vibration data collected under realistic conditions into a reliable and consistent detection of cracks with a relatively low false alarm rate. This process includes hardware configuration, signal excitation frequencies, signal processing, damage index calculation, side selection, data fusion and crack length estimation.

An SHM system according to the present disclosure may be deployed onboard an item, such as an aircraft, having one or more structures to be monitored for damage. The deployed onboard SHM system may reduce labor cost and time for unnecessary nondestructive evaluation (NDE) inspections, reduce the need for expensive teardowns at locations in aircraft of limited accessibility, provide robust indications of impending failure of the structure(s) to trigger safe retirement of the structure or item, and/or improved availability of the aircraft by limiting time in maintenance to times when actually necessary. Moreover, the embodiments described herein may benefit the design phase of an aircraft, or other item with which the SHM system is used. For example, the exemplary methods and systems may provide engineers with the means to reduce structure weight by avoiding conservative designs, reduce the need for costly assessments of fatigue critical locations, improve aircraft dynamic performance, and/or indirectly measure conditions of interest such as excessive loading or icing conditions of wings and other structures.

The methods and systems described herein may be implemented using computer programming or engineering techniques including computer software, firmware, hardware or any combination or subset thereof, wherein an exemplary technical effect may include at least one of: (a) creating a first model of an SHM system using a finite element model (FEM); (b) creating a second model of the SHM system using a FEM; (c) simulating signal propagation and response of the first model and the second model for a first frequency range comprising a plurality of excitation frequencies; and (d) determining, based at least in part on the simulating, a second frequency range within the first frequency range in which the simulated response of the SHM system exhibits a relatively high correlation with the structural damage.

Figure 2:
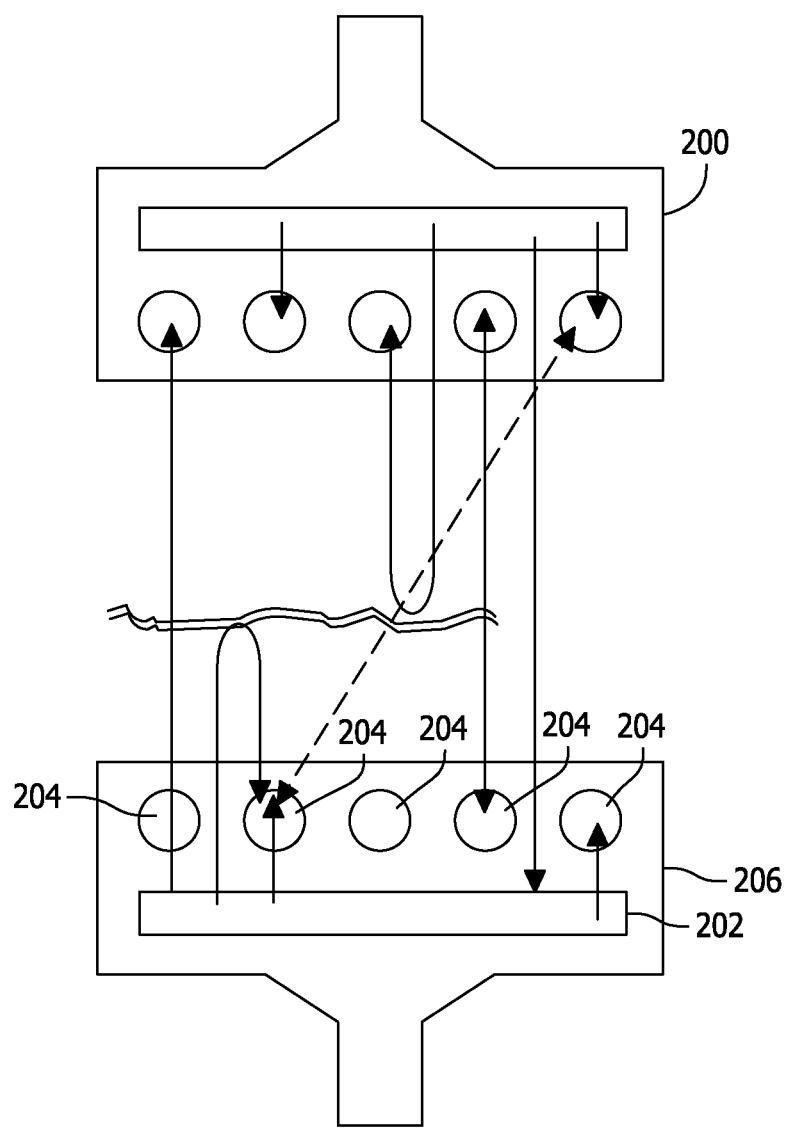
FIG. 2 is an exemplary piezoelectric transducer designed as part of the method shown in FIG. 1.

Referring more particularly to the drawings, FIG. 1 is a flowchart of an exemplary method 100 for use in designing an SHM system. FIG. 2 is an exemplary piezoelectric transducer designed as part of method 100.

After identifying a region where cracking, or other damage, is likely to occur (the 'Hot Spot'), at 102 a transducer patch or array is designed that can generate and receive vibration signals that are sensitive to the type of damage to be detected. In one exemplary embodiment, transducers 200, shown in FIG. 2, were designed as part of method 100. Each transducer 200 includes a rectangular piezoelectric transducer (PZT) 202 that functions as an actuator to generate a vibration signal. Round PZTs 204 function as sensors to detect the vibration signals generated by rectangular PZTs 202. In other embodiments, transducers 200 may have any other suitable shape and/or combination of actuator and sensor PZTs suitable for use in an SHM system as described herein.

Referring again to FIG. 1, at 104, a physics based simulation of the SHM system is performed. The simulation is used to identify the excitation frequencies for transducers 200 that will be most responsive to damage to the structure. Additionally, the simulation will provide a time window for damage index (DI) calculations.

Figure 3:
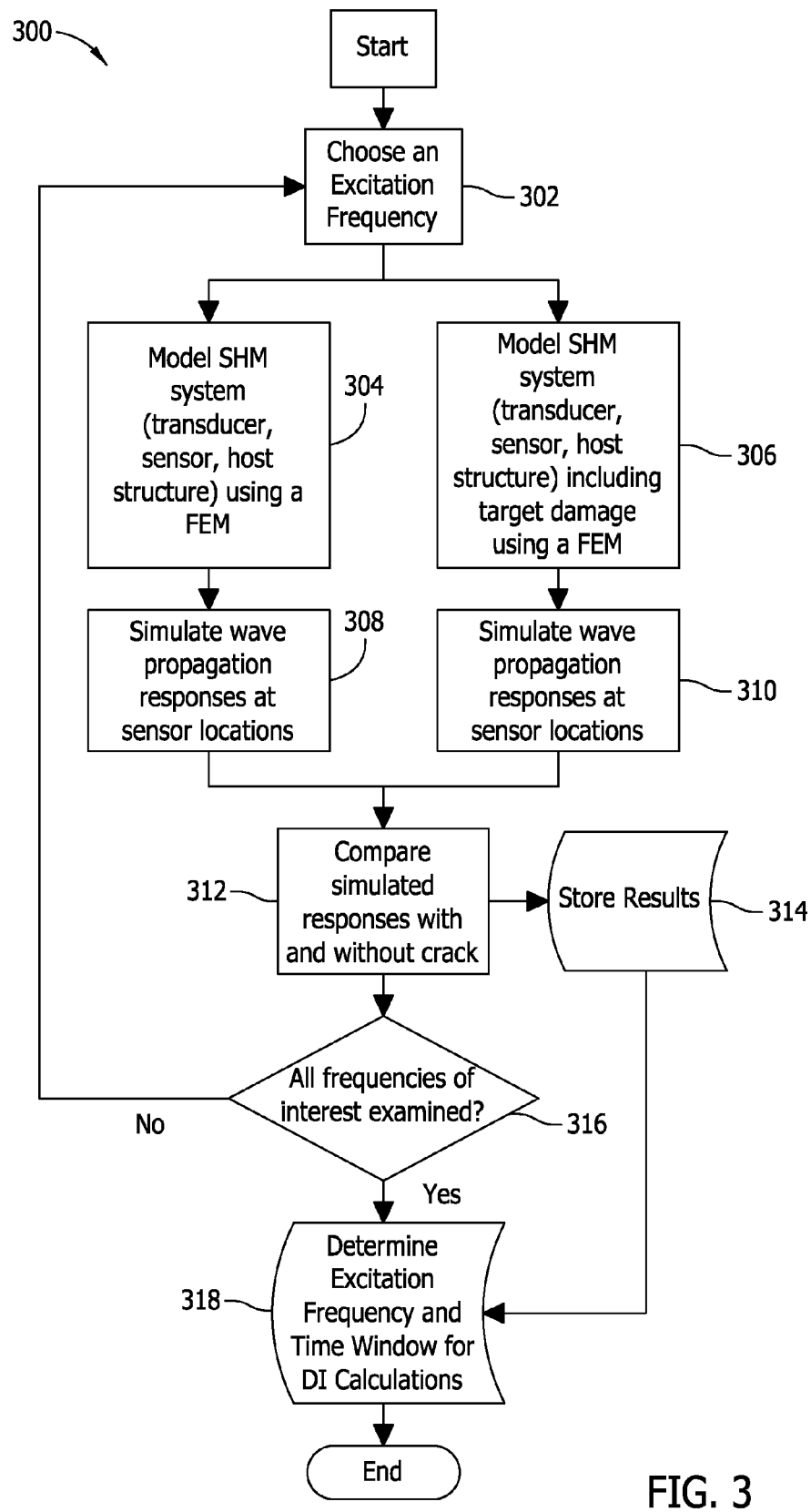
FIG. 3 is a flowchart of an exemplary physics based simulation for use as part of the method shown in FIG. 1.

FIG. 3 is a flowchart of an exemplary physics based simulation 300 for use at 104 of FIG. 1. Initially, an excitation frequency range for the transducers in the SHM system is chosen for evaluation. At 302, the lowest frequency within this range is selected. At this point, two models are created: a SHM system model (transducer, sensor, host structure) using a Finite Element Model (FEM) and no damage at 304, and a SHM system model (transducer, sensor, host structure) including target damage using a FEM at 306. At 308 and 310, signal propagation and response of each system is simulated. The response of each of these two systems is compared to determine the sensitivity of the system to damage at 312 and stored at 314. At 316, it is determined whether or not all frequencies within the range have been simulated. If all frequencies within the range have not been simulated, a new excitation frequency is then selected at 302 and the process is repeated. After all of the excitation frequencies of interest have been simulated, a smaller frequency range showing the greatest sensitivity to damage is chosen, at 318, to be evaluated in real world testing. In addition, the waveforms generated in the simulation are analyzed to determine which portion of the waveform is most sensitive to damage. For example, in a 6000 sample waveform, the range 300 to 1500 (the time window) may show the most changes between the undamaged and damaged states. This portion of the waveform may be selected to calculate damage indexes (DIs) from.

Returning to FIG. 1, at 106, background noise data from multiple test specimens that accurately represent the true structure to be monitored is collected. The purpose of this process is to collect data to characterize background noise of the system. This noise may cause variations in the value of any DI calculated for the system even when no damage is present. By characterizing this noise statistically, it is possible to calculate a false alarm rate for the SHM system.

Figure 4:
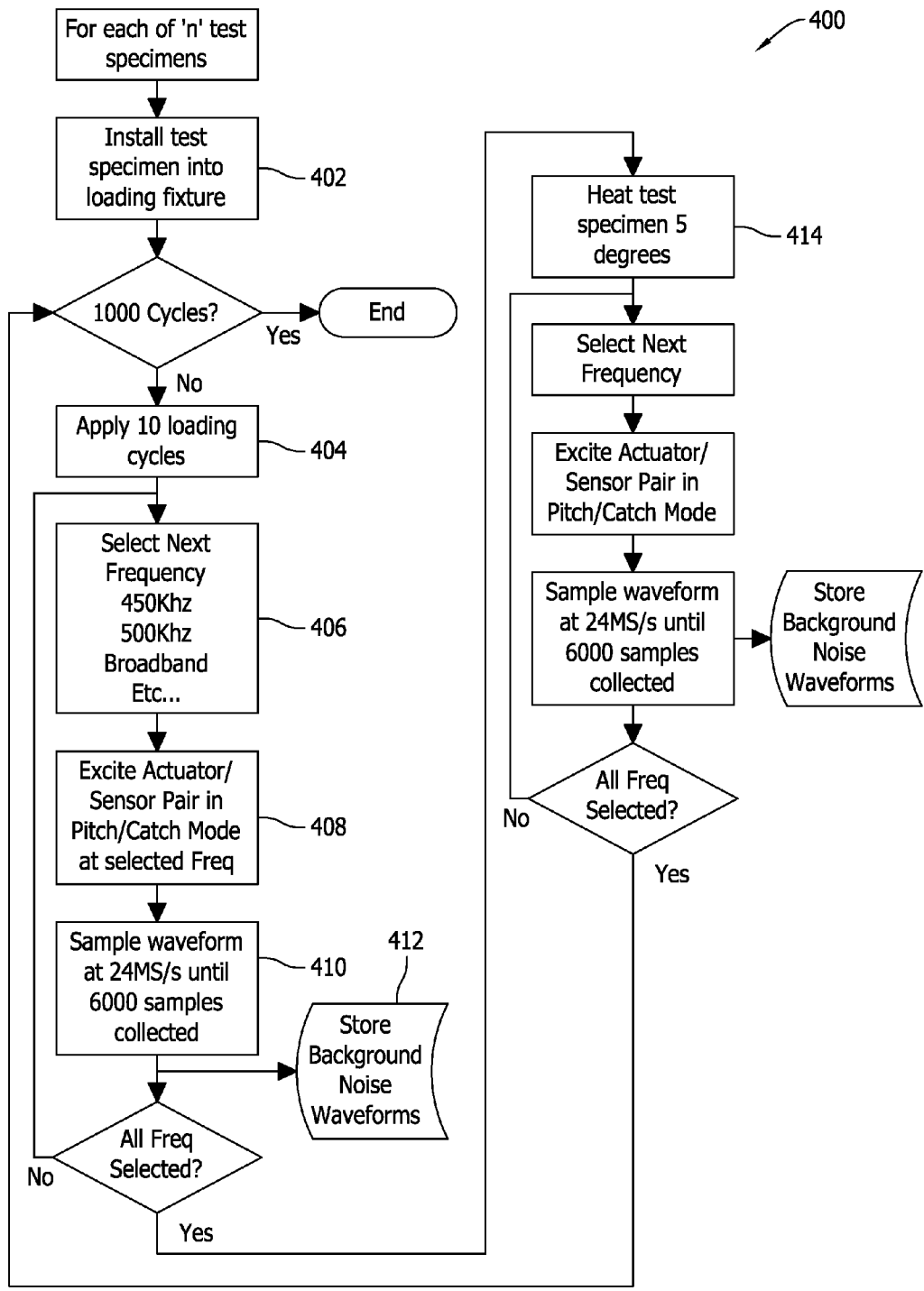
FIG. 4 is a flowchart of an exemplary background noise data collection method

A flowchart of one exemplary background noise data collection method 400 is illustrated in FIG. 4. For each test specimen of the structure, the test specimen should be installed in a loading fixture, at 402, such that the system can be perturbed by cyclically loading the structure (thereby simulating an aging factor). The perturbations will affect the structure making the noise waveforms later induced by the PZT actuators more realistic. It is important that the system not be loaded so much that damage in the form of cracking is possible. In the exemplary embodiment, ten loading cycles are applied at 404 before stopping and then exciting the structure. Next, an excitation frequency for the PZTs of the SHM system should be selected at 406. In one example embodiment the following frequencies were used: 250 KHz, 300 Khz, 350 Khz, 400 Khz, 450 Khz, 500 Khz. These frequencies were selected based on the physics based simulation. In other embodiments other suitable excitation frequencies may be selected. At 408, the first of the selected frequencies is applied to the PZT actuator(s) one at a time and the response of the PZTs is recorded at 410. In the exemplary embodiment, the response is sampled at a frequency at least ten times the excitation frequency. In other embodiments, other sampling frequencies may be used. In one embodiment, the PZT responses were sampled at 24 megasamples per second until 6000 sample points were recorded using appropriate hardware anti-aliasing filtering. This sampled waveform is stored at 412 along with the number of cumulative cycles applied and the ambient temperature. This process repeats until all excitation frequencies have been applied and recorded.

To account for signal changes due to thermal noise, the test specimen is heated, at 414, after all frequencies have been applied and recorded. In the exemplary embodiment the test specimens were heated to increase the temperature of the specimen five degrees Fahrenheit. In other embodiments, different temperatures may be used and a different number of temperatures may be tested. Depending on the environment in which the SHM system is intended to be used, multiple levels of temperature may be applied and recorded to test the performance of the temperature compensation algorithm (described below) and/or to select multiple temperature baselines or reference signals. After the specimen has been heated, the frequency selection, excitation application, and recording cycle for all selected frequencies, as described above, is repeated. After completion of the cycle at the increased temperature, it is determined whether or not the testing, both at ambient temperature and at the varied temperature(s) has been completed for 1000 load cycles. If yes, the process ends. If not, the entire process repeats until 1000 load cycles have been applied to the test specimen and tested. In other embodiments, more or fewer load cycles may be tested and more or fewer load cycles may be applied for each iteration of the test. The number of load cycles applied should be selected to ensure that no damage occurs to the test specimen. The background noise data collection for this specimen is now complete and the entire process should be repeated for the next specimen. The number of specimens from which noise data is collected may be any number suitable to provide a representative sample of background noise for the SHM system applied to the particular structure.

With reference again to FIG. 1, crack waveforms are collected from test specimens of the structure at 108. This data may be used to characterize potential DIs which in turn help determine the performance of the SHM system. This data is also used to determine the relationship between DI values and crack length.

Figure 5:
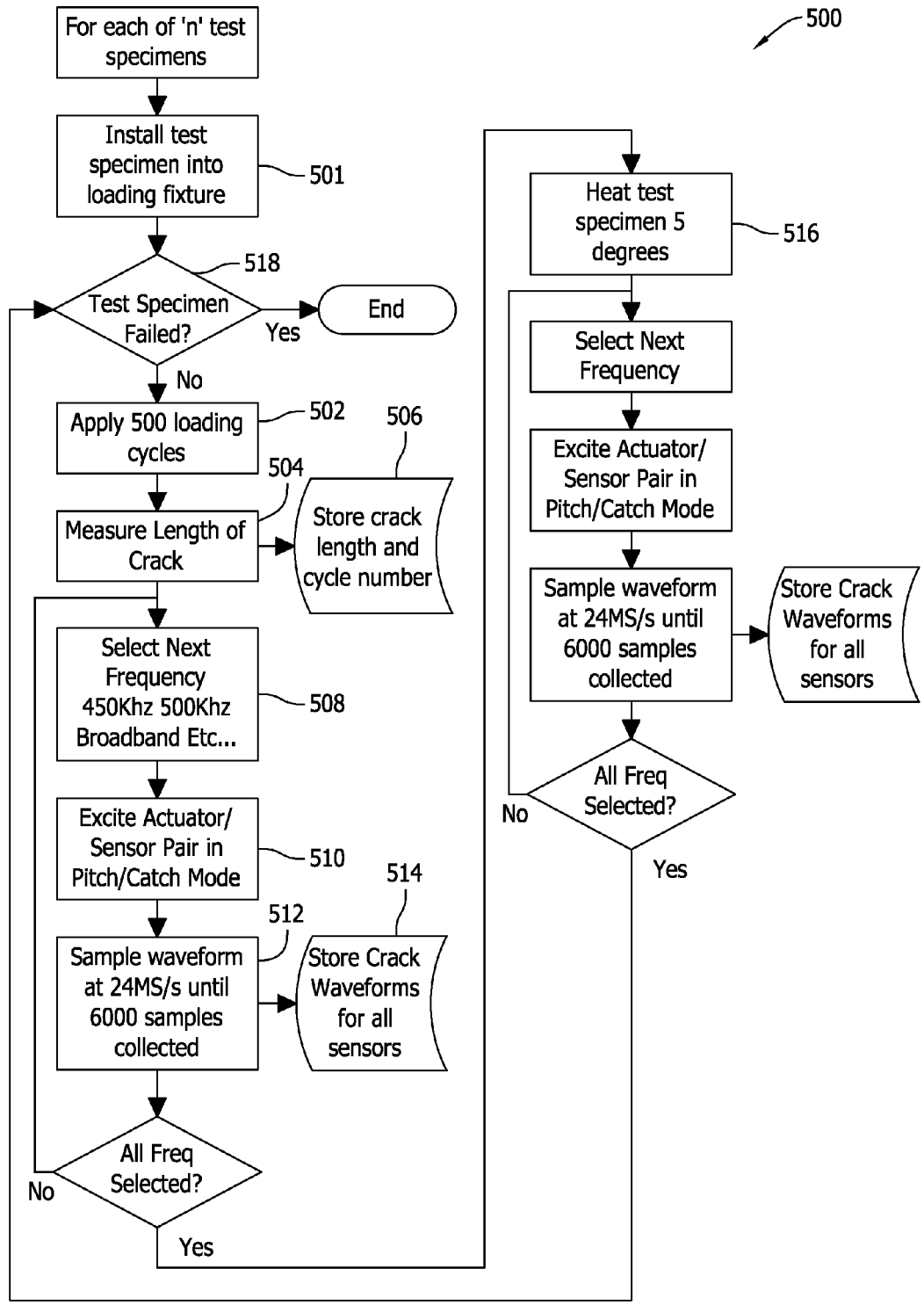
FIG. 5 is a flowchart of an exemplary method for collecting crack waveforms for use as part of the method shown in FIG. 1.

FIG. 5 is a flowchart of an exemplary method 500 for collecting crack waveforms. Method 500 is similar to method 400 shown in FIG. 4, except that test specimens of the structure are subjected to an aging factor (such as cyclical loading, temperature cycling, etc.) and tested until failure of the structure. In the exemplary embodiment, loading cycles are applied to the structure. More loading cycles are applied in each iteration, and the length of cracks developing on the structure are periodically measured and stored along with the sampled waveforms. For each test specimen, the test specimen should be installed 501 in a loading fixture such that the system can be strenuously loaded to cause cracking in the test specimen. In the exemplary embodiment, 500 loading cycles where applied, at 502, in each measurement cycle. In other embodiments, more or fewer loading cycles may be applied. The test specimen is inspected for cracking. If a crack is detected, is length is measured at 504 and this measurement is stored along with the cycle number at which the crack occurred at 506. The inspection may be a visual inspection or may be based on any conventional nondestructive evaluation technique.

At 508, an excitation frequency is selected from a range of excitation frequencies. In the exemplary embodiment the following frequencies were used: 250 KHz, 300 Khz, 350 Khz, 400 Khz, 450 Khz, and 500 Khz. At 510, the first of the selected frequencies is applied to the PZT actuator(s) one at a time and the response of the PZTs is sampled at 512. In the exemplary embodiment, the response is sampled at a frequency at least ten times the excitation frequency. In other embodiments, other sampling frequencies may be used. In one embodiment, the PZT responses were sampled at 24 megasamples per second until 6000 sample points were recorded using appropriate hardware anti-aliasing filtering. This sampled waveform is stored at 514 along with the number of cumulative cycles applied and the ambient temperature. This process repeats until all excitation frequencies have been applied and recorded.

To account for signal changes due to thermal noise, the test specimen is heated, at 516, after all frequencies have been applied and recorded. In the exemplary embodiment the test specimens were heated to increase the temperature of the specimen five degrees Fahrenheit. In other embodiments, different temperatures may be used and a different number of temperatures may be tested. Depending on the environment in which the SHM system is intended to be used, multiple levels of temperature may be applied and recorded to test the performance of the temperature compensation algorithm (described below) and/or to select multiple temperature baselines or reference signals. After the specimen has been heated, the frequency selection, excitation application, and recording cycle for all selected frequencies, as described above, is repeated. After completion of the cycle at the increased temperature, it is determined, at 518 whether or not the test specimen has failed (e.g., been destroyed, been damaged beyond repair, been damaged beyond proper functioning, etc.). If yes, the process ends. If not, the entire process repeats until the test specimen fails. The crack length data collection for this specimen is now complete and the entire process should be repeated for the next specimen. The number of specimens from which noise data is collected may be any number suitable to provide a representative sample of crack length data for the SHM system applied to the particular structure.

Referring again to FIG. 1, at 110, the collected data described above is used to evaluate a suite of DIs to find the best performing one in terms of Probability of Detection (POD) and crack length prediction interval.

Figure 6:
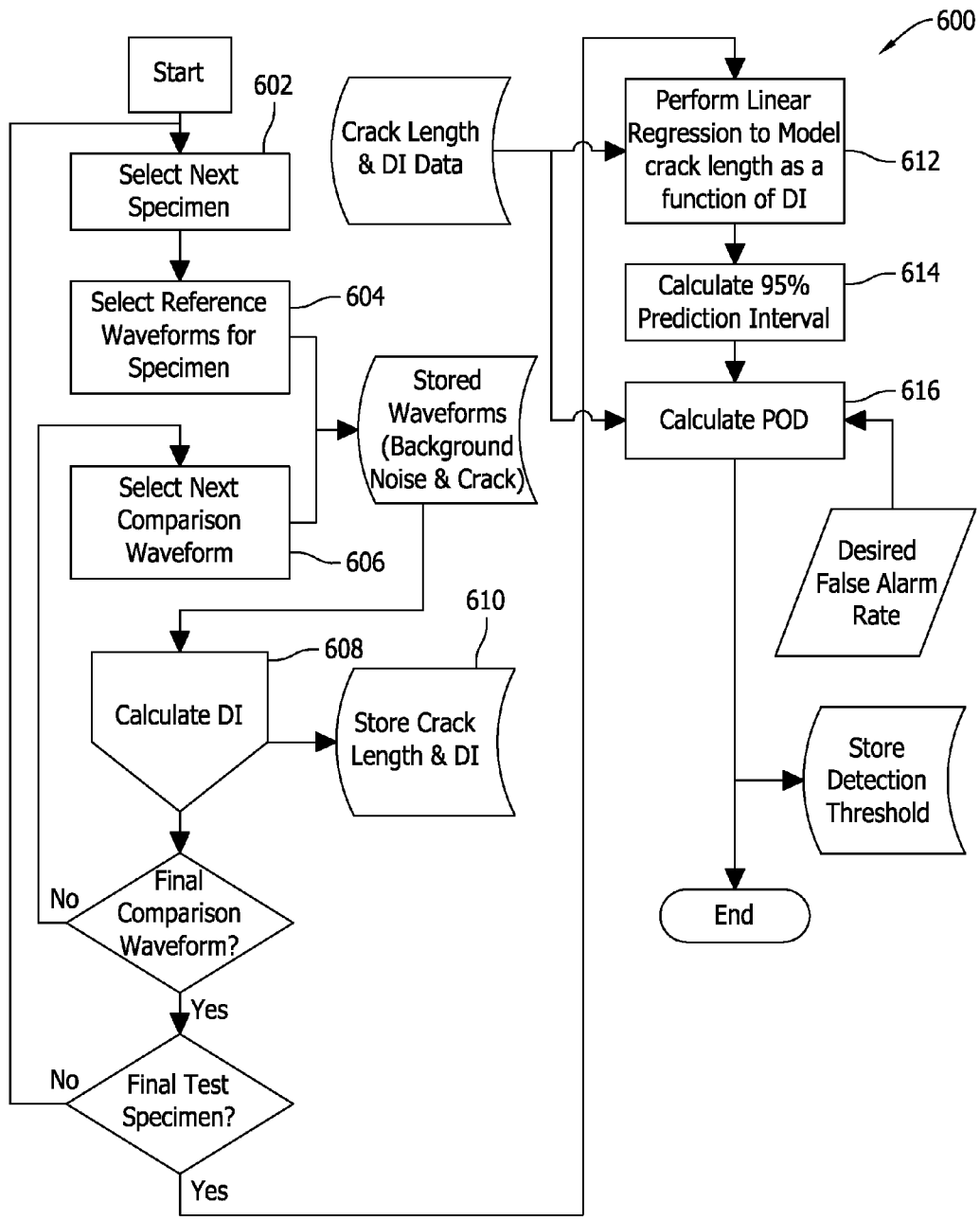
FIG. 6 is a flowchart of an exemplary method for use in evaluating the suite of DIs for use as part of the method shown in FIG. 1.

FIG. 6 is a flowchart of an exemplary method 600 for use in evaluating the suite of DIs. In general, a DI, a Probability of Detection Curve, an associated $a_{90/95}$ value, and a prediction interval can all be calculated with any given technique or algorithm and used as a means for comparing the relative efficacy of various candidate Damage Index values. Starting with the first test specimen at 602, a suitable reference waveform for the specimen is identified at 604. The reference waveform is selected to be a waveform that was sampled after loading of the test specimen began, but before there was any chance of actual cracking. In the exemplary embodiment, the reference waveform taken at the 500th cycle of loading was selected. This reference waveform (for a given temperature) will not change for the rest of the evaluation.

Figure 12:
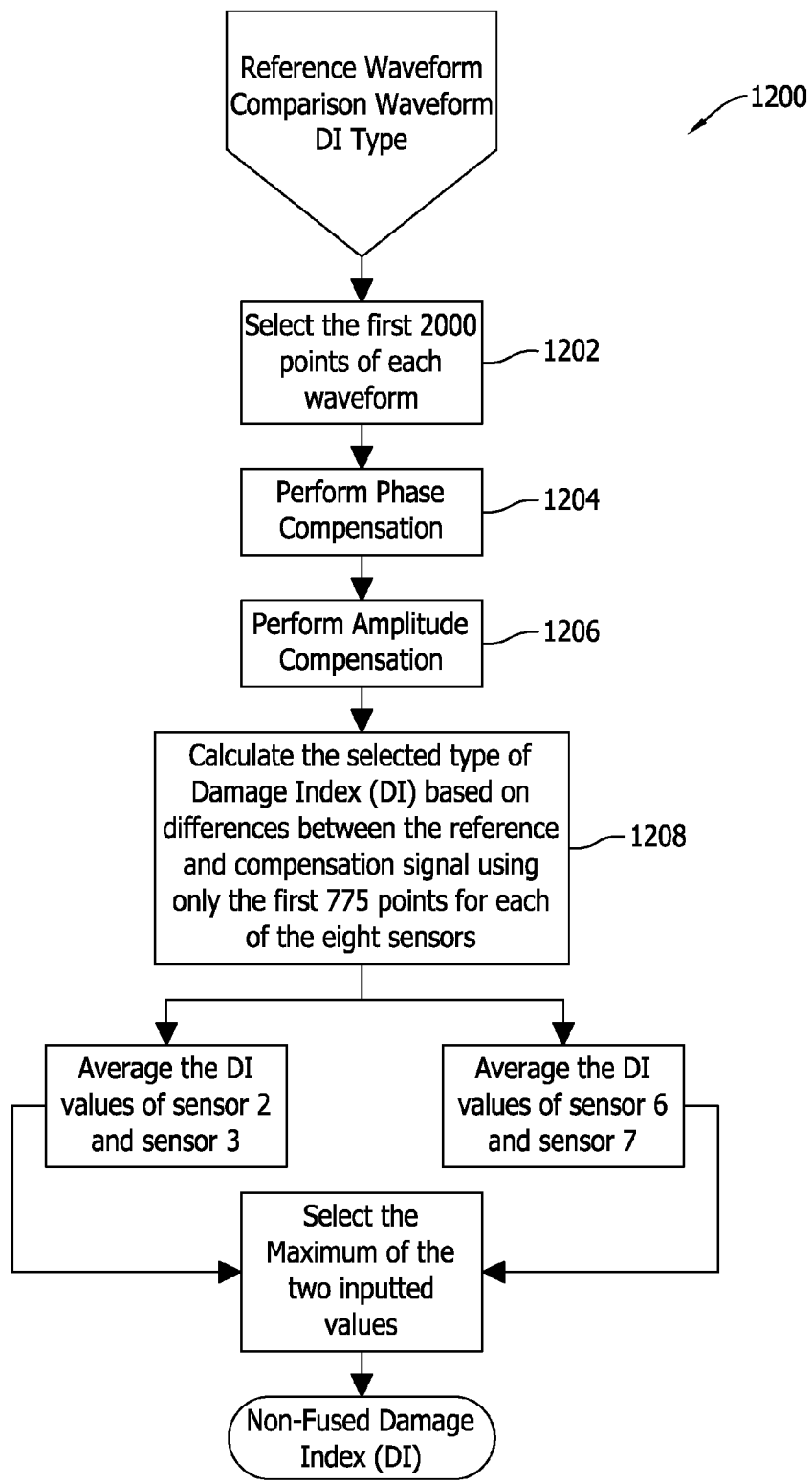
FIG. 12 is an exemplary method for use in calculating a damage index (DI) for use as part of the method shown in FIG. 1.

At 606, a comparison waveform is selected. The comparison waveforms are selected sequentially beginning with the first waveform collected after the reference waveform was selected. Thus, in the exemplary embodiment, the first comparison waveform is the first waveform recorded after the 500th cycle. The reference and comparison waveforms are then used as inputs to the process for calculating a given DI at 608. An exemplary method 1200 for use in calculating the DI is shown in FIG. 12 and will be described in detail below.

Returning to FIG. 6, once the DI has been calculated, it is stored, along with its corresponding crack length, in a database at 610. For each waveform that was stored in the waveform collection phase, the above process is repeated until no more comparison waveforms remain. The data from the next test specimen is then selected at 602 and the entire process until the data from all test specimens has been processed.

Figure 7:
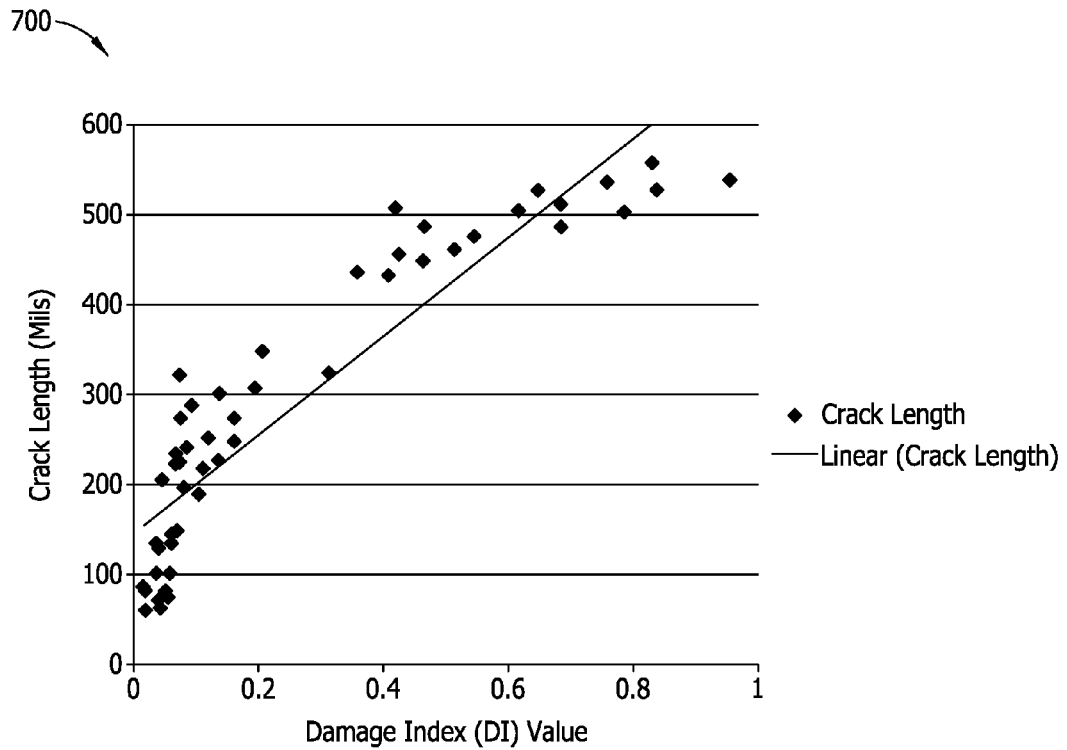
FIG. 7 is a graph of example measured crack length data plotted against calculated DI for use as part of the method shown in FIG. 1.

At this point, all specimens and waveforms have been processed, and there is a DI value for every crack measurement, including crack sizes of zero. FIG. 7 is a graph 700 of example measured crack length data plotted against calculated DI. In many instances, including the exemplary embodiment, there will be a nonlinear relationship between crack length and DI as shown.

Figure 8:
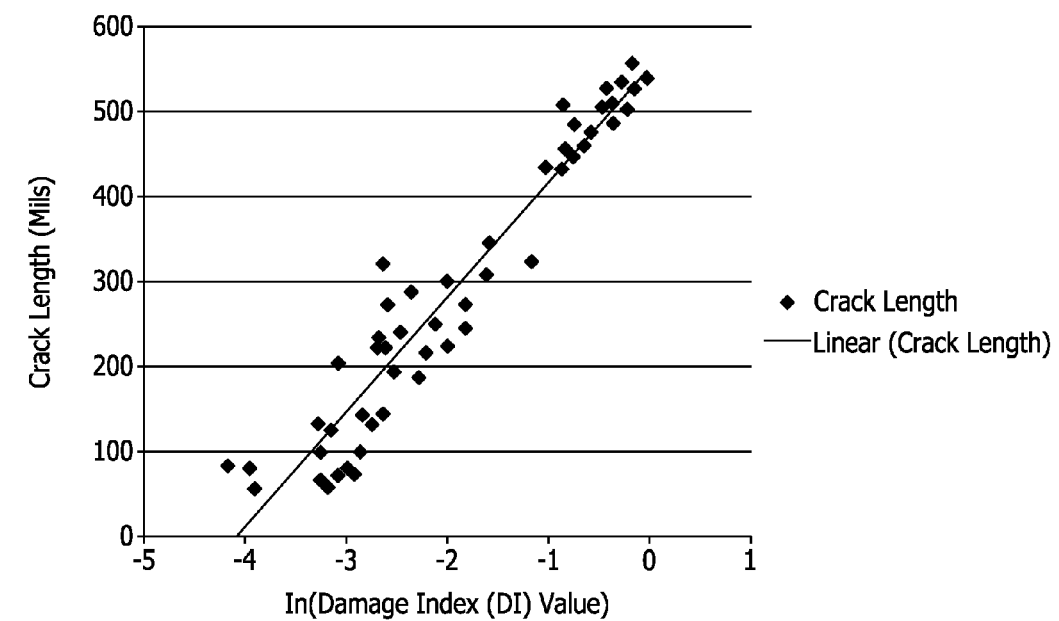
FIG. 8 is a graph of crack length to natural logarithm of the DI values for use as part of the method shown in FIG. 1.

At 612 of FIG. 6, a linear regression is performed to model crack length as a function of DI. Linear regression is a well-known statistical technique and will not be described in detail herein. To perform linear regression, the relationship between the two variables should be a straight line and random errors of the model (e.g., the scatter about the fit line) should generally remain constant. If the relationship is nonlinear as shown in FIG. 7, the data should be transformed such that the transformed relationship is linear. In the exemplary embodiment, this is accomplished by taking the natural logarithm of the DI value. The resulting graph 800 of crack length to natural logarithm of the DI values is shown FIG. 8. In other embodiments, any other suitable technique to transform the relationship to a linear relationship may be used.

After the linear regression is performed, a 95% prediction interval of the linear regression model is calculated at 614. The 95% prediction interval is the area in which you expect 95% of all data points to fall. Thus with 95% confidence, the crack length will be between the mean output of the linear regression model±the prediction interval. The prediction interval is:

$$\pm \tau_{0.025, n-2} \sqrt{\left[\frac{n+1}{n} + \frac{(x_0 - \bar{x})^2}{S_{xx}}\right] \frac{SS_R}{n-2}}, \quad (1)$$

where: $\pm \tau_{00.25, n-2}$ is students t-distribution with alpha=0.025, n is the number of data points (also referred to as the degrees of freedom), x is the DI values (transformed as appropriate), $(x_0 - \bar{x})$ is the mean value of x subtracted from each value of x, and $S_{xx}$ is $\Sigma_{i=1}^{n}(x_0 - \bar{x})^2$. $SS_R$ is $\Sigma_{i=1}^{n}(y - \hat{y})^2$, where y is the measured crack value and $\hat{y}$ is the estimated y value.

Figure 9:
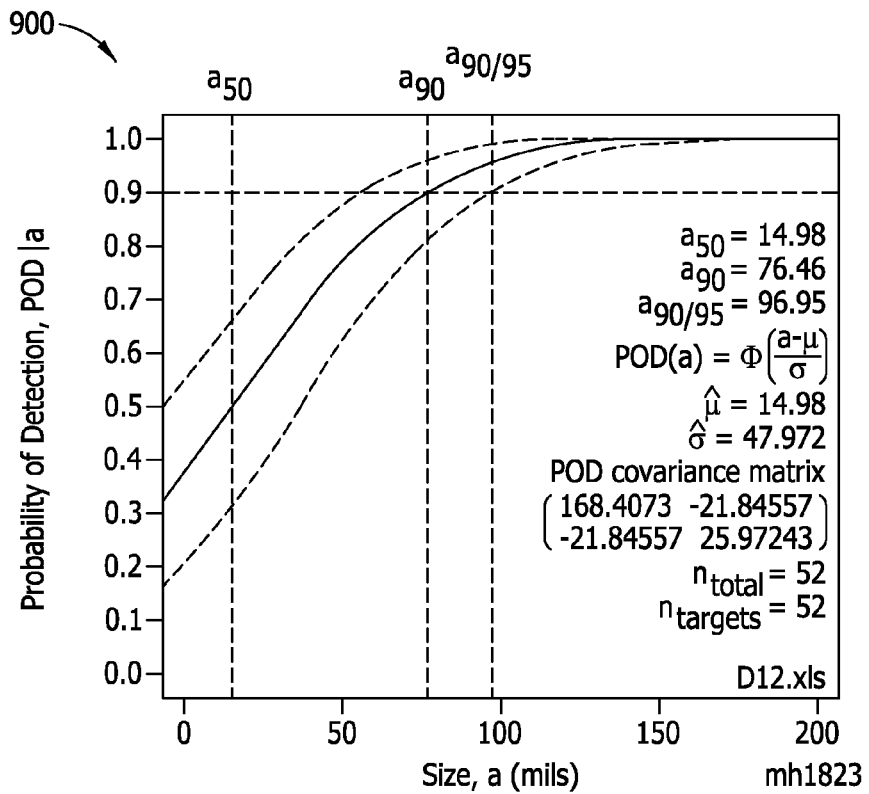
FIG. 9 is an exemplary probability of detection (POD) curve for use as part of the method shown in FIG. 1.

At 616, a Probability of Detection (POD) curve is calculated. The POD curve generally provides information about the smallest crack size that can be reliably detected by an inspection system. An exemplary graph 900 is shown in FIG. 9. This information is commonly used in 'Damage Tolerant Design', where it is assumed that the structure initially contains cracks, and those initial crack sizes are determined by inspection limits. Based on assumed or measured loads, a crack model predicts that the crack will grow over time until fracture occurs. The design life is then calculated as the time to fracture divided by two (as a safety measure). Before the discussion of the method of calculating the POD curve, the term 'POD 90/95' must be explained. For a given flaw size "a", POD $a_{90/95}$ indicates a 90 percent detection rate of a crack of length "a" at a 95% confidence level. In other words, POD $a_{90/95}$ indicates 95% confidence that at least 90% of the defects of a specific size ("a") will be detected. The confidence level is a statistical concept that quantifies the uncertainty in the estimation of a 90% detection rate.

Any suitable process for calculating a POD curve may be used. In the exemplary embodiment, the POD curve is calculated in accordance with MIL-HDBK-1823A: "Nondestructive Evaluation System Reliability Assessment", Apr. 7, 2009. In the exemplary embodiment, an "a vs. â" POD curve calculation is performed. Forty or more test samples are created. Ideally the target crack sizes are uniformly spaced on a Cartesian scale. The crack size is estimated by correlating the size of a DI also known as "â" to the size of a known crack "a". The correlation is accomplished using linear regression. Initially, x=f(a) and y=g(â), where f and g are either linear or logarithmic functions selected such that x and y are linearly related. An estimation of y is found by:

$$y = \beta_0 + \beta_1 x + e \quad (2),$$

where $\beta_0$ and $\beta_1 x$ are coefficients to be solved for and 'e' is the residual error, which is normally distributed with a zero mean and a variance $\delta^2$. A threshold "$y_{th}$" is set somewhere near the measured system noise level. $\Phi(z)$ is the standard normal cumulative distribution function and $Q(z)$ is the survivor function: $1-\Phi(z)$. The POD function is derived as follows:

$$POD(a) = \quad (3)$$
$$P(y > y_{th}) = Q\left[\frac{y_{th} - (\beta_0 + \beta_1 x)}{\partial}\right] = 1 - Q\left[\frac{x - (y_{th} - \beta_0)/\beta_1}{\partial/\beta_1}\right]$$

Letting $u = \frac{(y_{th} - \beta_0)}{\beta_1}$ and $\sigma = \frac{\delta}{\beta_1}$ yields:

$$POD(a) = 1 - Q\left[\frac{f(a) - u}{\sigma}\right] \quad (4)$$

Figure 10:
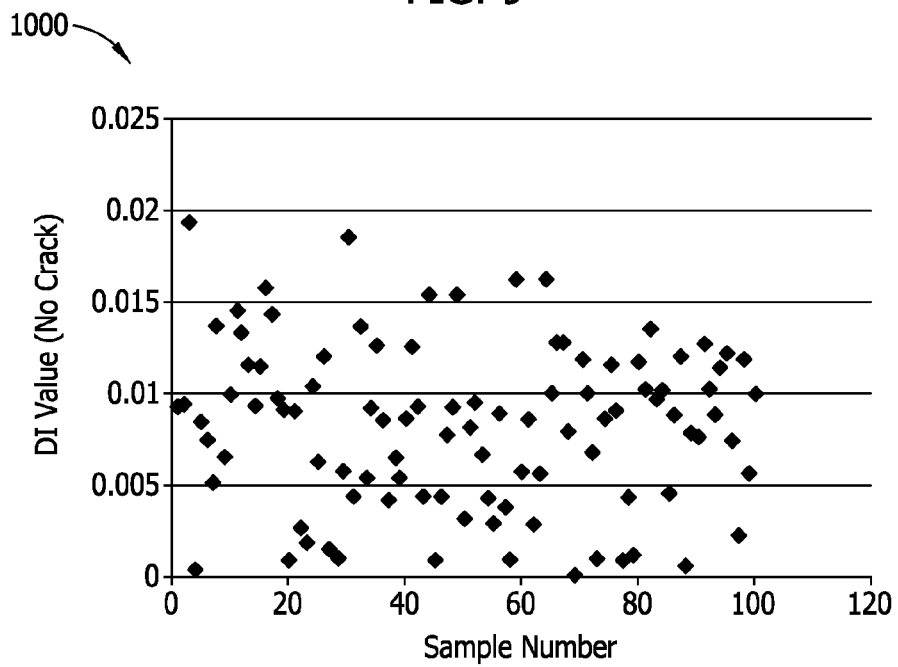
FIG. 10 is a graph of background noise data collected by the process described with respect to FIG. 4.

The process of collecting background noise data was described above with respect to FIG. 4. The background noise data is used in the calculate POD block 616 to calculate the crack detection threshold. One example of background noise data collected by the process described with respect to FIG. 4, is shown in FIG. 10.

Figure 11:
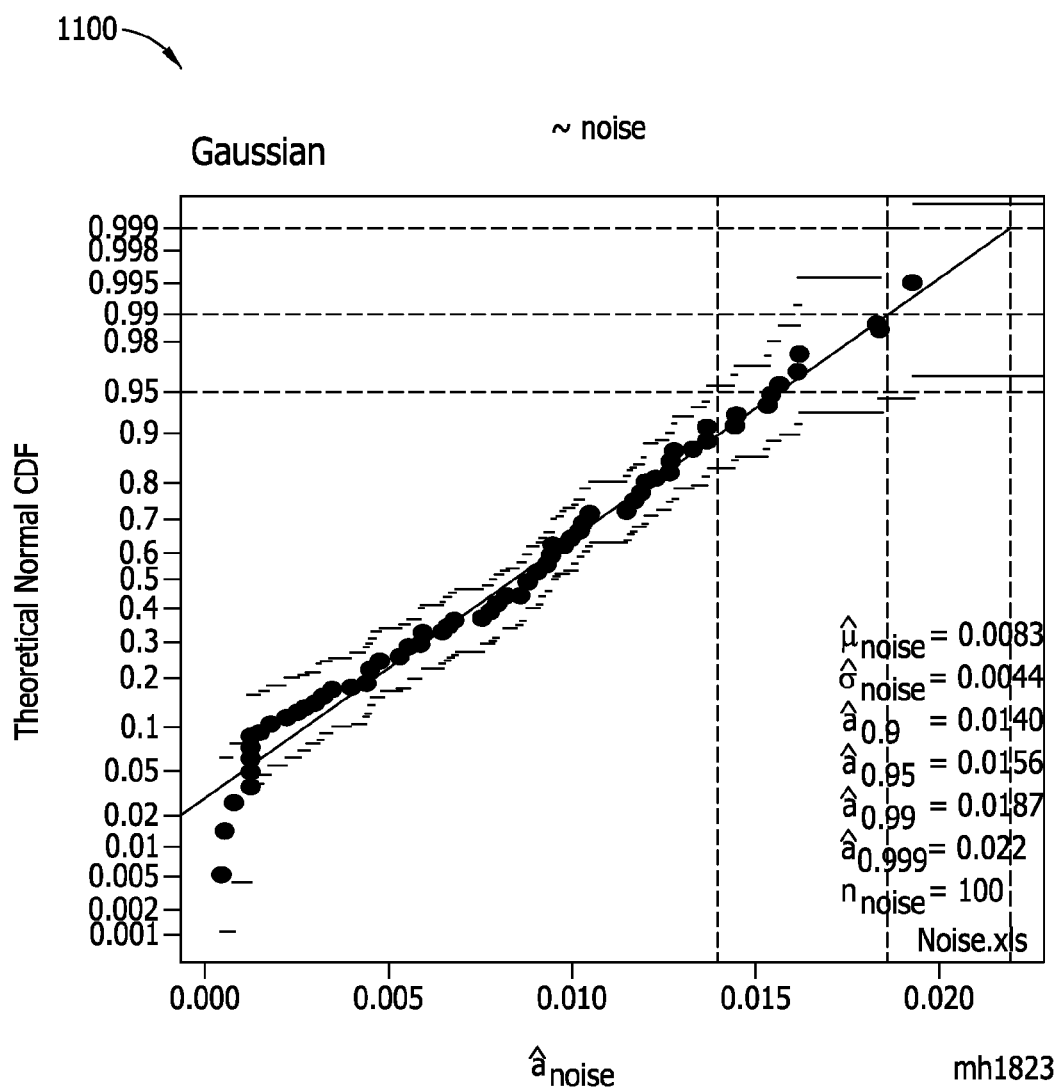
FIG. 11 is a Gaussian plot of noise data shown in FIG. 10.

If the background noise is analyzed and found to be well represented by a known statistical distribution, the calculated distribution can be used to determine the false alarm rate of a system for any given detection threshold $y_{th}$. FIG. 11 shows a Gaussian 'probability paper' plot 1100 of the noise data that was shown in FIG. 10. In other embodiments, the noise data may be represented by any other suitable statistical distribution including, for example, Weibull, Exponential, or Log-Normal. Based on the fact that the data points lie on the line shown on Gaussian 'probability paper' plot 1100, it may be determined that the noise has a Gaussian distribution and the parameters of that distribution may be calculated using any known statistical methods. Once the parameters are known, the probability of a noise value being above a given threshold ($y_{th}$) is easily calculated as per standard statistics. The probability of the background noise being below various threshold values is shown on plot 1100. Given a particular detection threshold value ($y_{th}$) such as 0.021, it can be seen that the background noise will exceed this value 1% of the time and 99% of the time the noise will be below this value. Thus, any desired value for a false alarm rate may be selected and the corresponding threshold value (to get that false alarm rate) can be calculated from the noise distribution by entering (1–probability of false alarm) into the inverse cumulative distribution function.

A flowchart of a method 1200 for use in calculating a DI, such as at block 608 in FIG. 6, is shown in FIG. 12. In method 1200, a reference waveform and a comparison waveform are selected as described above with reference to FIG. 6 and passed to the block 1202 in FIG. 12. In the exemplary embodiment, each waveform is 6000 samples in length and only the first ⅓ or 2000 data points are processed. In other embodiments longer or shorter waveforms may be used and larger or smaller fractions of that waveform, up to and including the entire waveform, may be used. At 1204, phase compensation is performed to account for signal changes due to temperature variations. At 1206, amplitude compensation begins with normalization of the comparison waveform y(n) using:

$$y' = \frac{y(n)}{\sqrt{\sum_{n=0}^{N-1} y^2(n)}} \quad (5)$$

Baseline waveform x(n) is scaled to minimize the mean squared energy between it and the unity energy signal y'(n) by:

$$x'(n) = A \cdot x(n), \quad (6)$$
where:

$$A = \frac{\sum_{n=0}^{N-1} x(n) y'(n)}{\sum_{n=0}^{N-1} x^2(n)} \quad (7)$$

These scaled and phase compensated waveforms then become the new reference and comparison waveforms.

At 1208, a selected type of DI is calculated using the compensated signals. In the exemplary embodiment, only the first 775 points of the compensated signals are used. This range (1 to 775) was selected by determining the portion of the signals most sensitive to damage using the physics based simulation as described above with reference to FIG. 3. In some cases the beginning part of a signal may be corrupted with cross talk and later parts of the signal may get extremely complex with multiple reflections. The application and the physics simulation will determine the proper signal interval. Moreover, different materials and geometries may respond differently to the various possible damage indexes. A group of DIs can be chosen from the known groups and/or independently developed. In some embodiments, these groups are all run through the method 600 (shown in FIG. 6) and their relative POD and prediction intervals should be compared to select the best one for a given application. In the exemplary embodiment, a drop in correlation coefficient was selected as the type of DI. The drop in correlation coefficient is:

$$F_{DCC} = 1 - \sigma_{xy} \quad (8),$$

where $\sigma_{xy}$, is the correlation coefficient between x(n) (the compensated reference signal) and y(n) (the compensated comparison signal). This DI measures how well the reference and comparison waveforms are correlated with one another. Two perfectly correlated waveforms will have a DI of zero whereas two uncorrelated waveforms will have a DI of 1.

Figure 13:
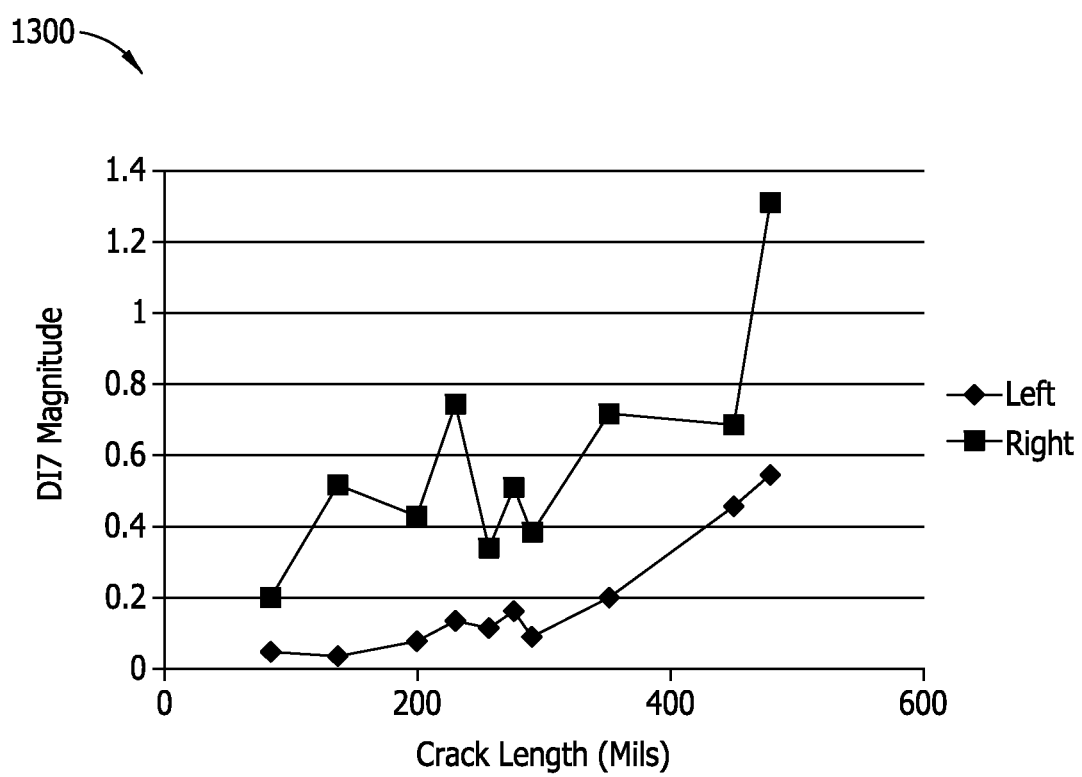
FIG. 13 is a graph of an example comparison of the averaged value of two DIs on the left side of a transducer vs. the averaged values of two DIs the right side of the transducer for use as part of the method shown in FIG. 1.

It may be desirable to detect on which side of a structure a crack is appearing. In the exemplary embodiment, eight sensors are used on each PZT in the SHM system. The data from the eight sensors can potentially be used to calculate eight different DIs and thus estimate eight different crack lengths. Sensors located on the same side of the PZT as the crack should produce a higher DI value than those located on the opposite side. The DI values of two sensors on one side of a transducer are averaged together and the DI values from two sensors on the other side are averaged together. The averaging of two DIs reduces noise in the system. FIG. 13 is a graph 1300 of an example comparison of the averaged value of two DIs on the left side of a transducer vs. the averaged values of two Dis the right side of the transducer. Note that the right side being bigger indicates a crack on the right side of the structure. Thus, after the averages are computed for each side of the transducer, the transducers corresponding to the higher DI values are chosen to be the reported DI value.

Returning to FIG. 1, at 112 a data fusion Bayesian network is built. Bayesian networks, also referred to as Bayesian belief networks, provide a means of fusing data from multiple and disparate sources in a mathematically rigorous and probabilistic framework. They are directed graphs where the nodes represent random variables and the arrows connecting them show the probabilistic dependencies between them. Each node has associated with it a Conditional Probability Table (CPT). The table holds the conditional probabilities relating the states of its parents to the probability of its own states. Bayesian networks can also be thought of as a compact representation of a complete joint probability table of the random variables under consideration. The advantages of Bayesian networks include natural handling of uncertainty and explicit fusion of diverse input data. They are also modular, which allows the system to grow and improve over time by inserting additional nodes or sub-graphs. A Bayesian network can improve its performance by means of learning from historical data stored in a database.

Bayesian modeling of crack length enables direct use of DI's as well as fusing in information about an aging factor, such as load cycles. Load cycles are a different source of information than DIs and thus, should provide a significant boost in crack length estimation accuracy. Together, they will enable a probabilistic estimation of crack length and false alarm probability.

It should be noted that although this disclosure discusses load cycles as the aging factor, any information related to the life of the structure can be substituted. For example Fatigue Life Expended (FLE) which is a function of strain peaks and valleys is also a viable aging factor. If load cycles during specimen testing is not considered an adequate representation of the real world conditions, another option is to use crack growth algorithms along with inspection data from fleet-wide inspection. For example, unexpected cracking found at a structure can sometimes result in a fleet-wide inspection of a structure. In this case crack lengths and strain cycle information will be known for all aircraft at a single moment in time. Crack growth algorithms could then be used to estimate crack lengths forward and backward in time to gain a probabilistic estimate of crack length as a function of real world strain cycles in a way analogous to the technique discussed below.

The basic structure of a Bayesian network in the exemplary embodiment includes crack length dependent on the number of load cycles the structure has been though, and DI dependent on crack length. Having access to both types of information will give a better estimate (e.g., having a smaller uncertainty value) of crack length than either alone.

Figure 14:
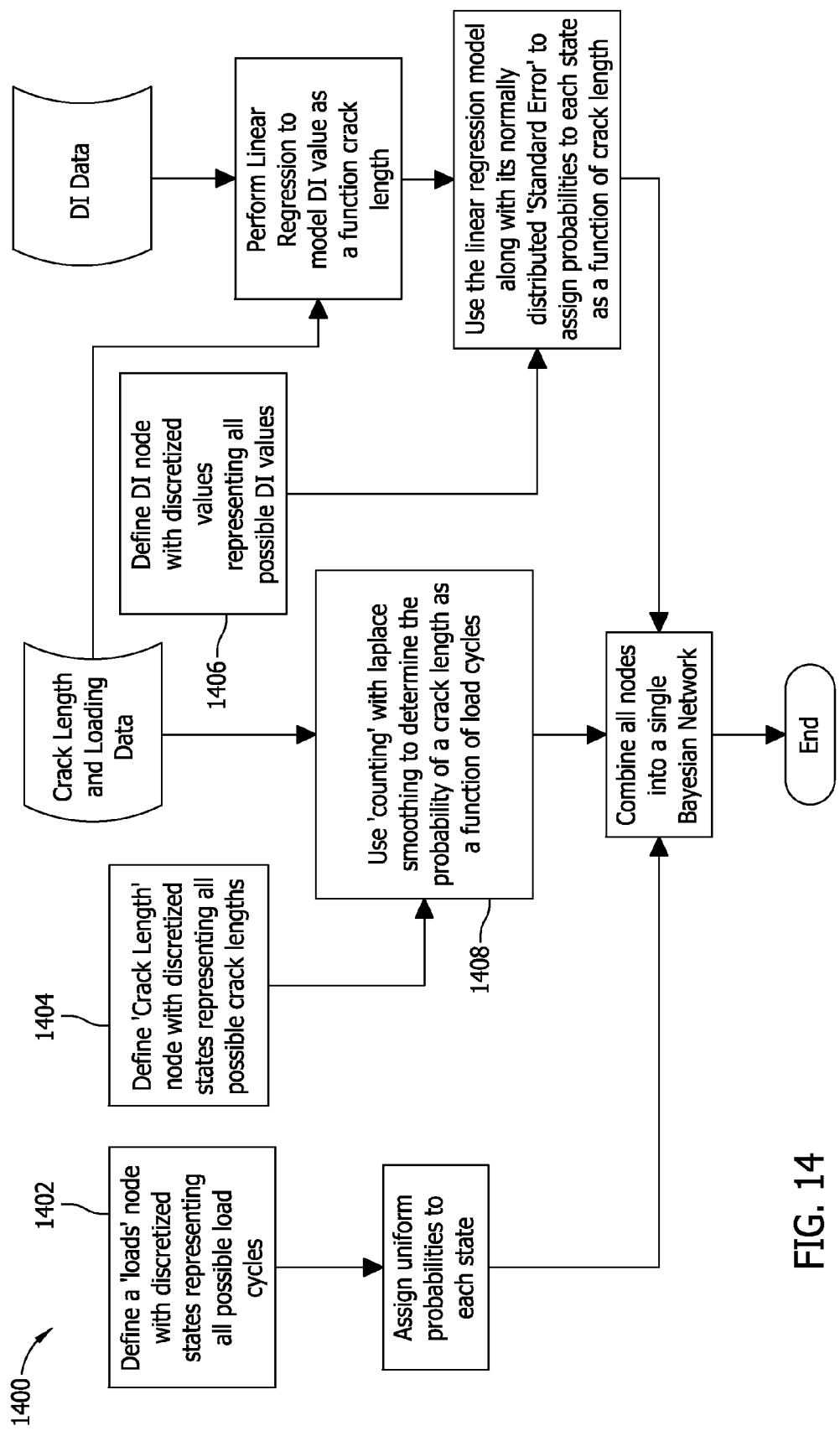
FIG. 14 is a flowchart of a method for use in building a Bayesian network for structural health monitoring data fusion for use as part of the method shown in FIG. 1.

FIG. 14 is a flowchart of a method 1400 for use in building a Bayesian network for structural health monitoring data fusion. At 1402, 1404, and 1406, the nodes of the Bayesian network are defined. Each node represents a discrete random variable that can take on one of 'n' possible values, each with a probability 'p'. In the exemplary embodiment, the nodes include a loads node, a crack length node, and a DI node. FIG. 15 illustrates the loads node. This node has 50 possible states, where each state is 1.64e3 cycles long. The highest load cycle value should guarantee a fracture (or the largest crack size of interest). Because the current load cycle will always be known, the prior probabilities of each of the states does not need to be known and are set to equal values of 2% each.

Figure 16:
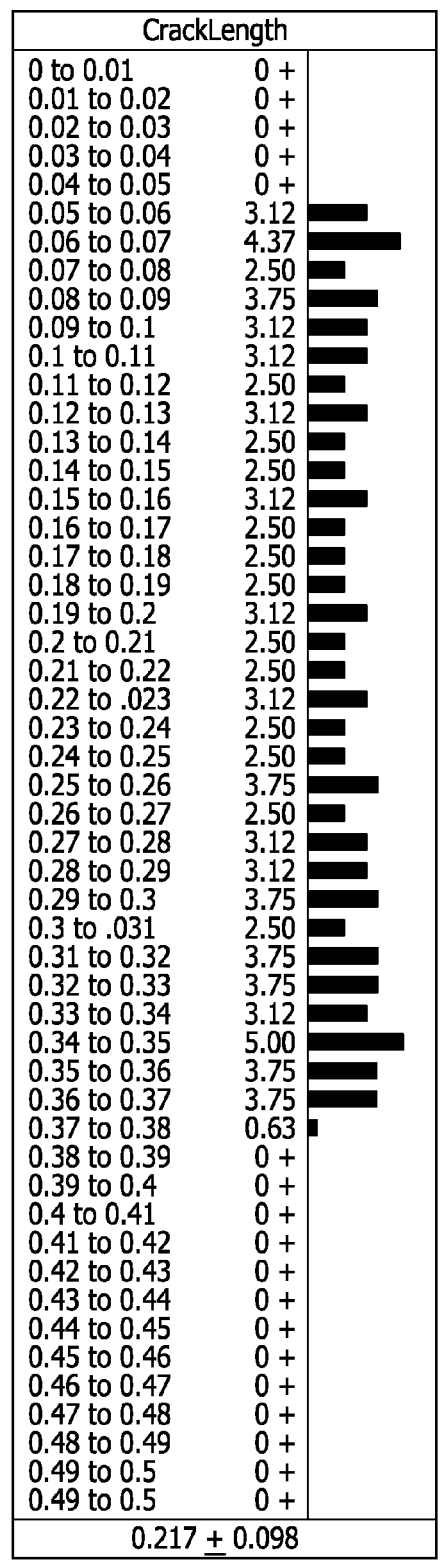
FIG. 16 is a prediction resolution developed as part of the method shown in FIG. 14.

The second node to define is the crack length node. The probabilities for this node are generated as a function of load cycles. Continuous variables in Bayesian networks must be discretized in order to function. The values for crack length were set with the following reasoning in the exemplary embodiment, but may be set higher or lower in other embodiments. Due to the fact that cracks of around 0.2" can be reliably detected, the maximum crack length was set to 0.50", with 'greater than' 0.5" being the final category. Fifty one intervals were used, meaning there is a 10 mil, i.e., ten thousandths of an inch, prediction resolution as shown in FIG. 16.

Figure 17:
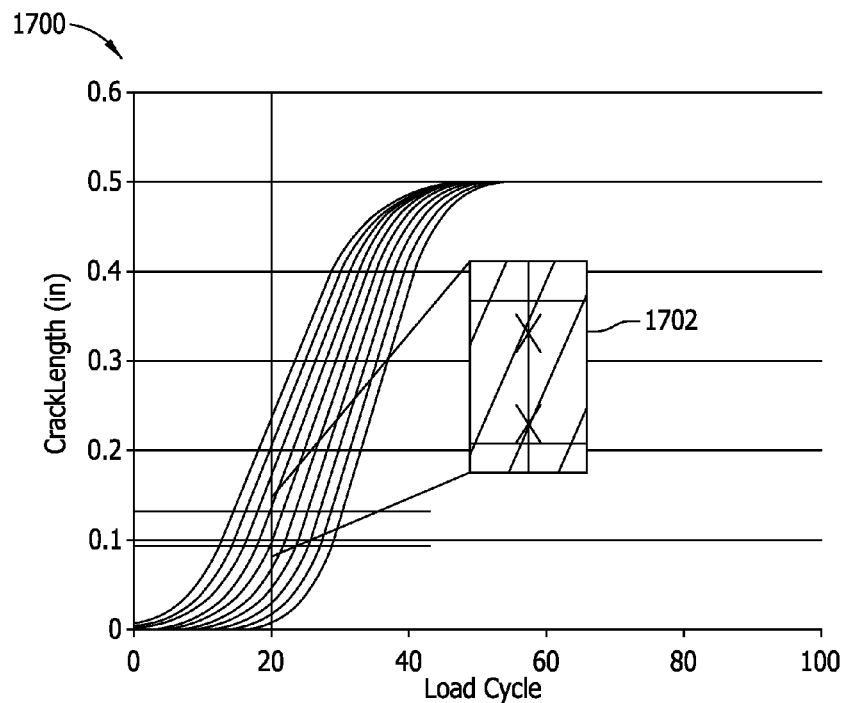
FIG. 17 is a graph 1700 showing how probabilities can be calculated by using load cycle vs. crack length data collected from the test specimens

The next step is to fill out the Conditional Probability Table or CPT of the crack length node at 1408. This table includes the probability of a crack length being within a certain crack length interval as a function of load cycles. These probabilities can be calculated by using the load cycle vs. crack length data collected from the test specimens as described above. FIG. 17 is a graph 1700 showing how this may be done in the exemplary embodiment case. Given a particular number of load cycles, the probability of a crack length being within a certain range can be calculated by dividing the number of curves passing through that region by the total number of curves. Inset 1702 shows that two curves out of ten have a crack length of between 0.08" and 0.14" after 20 loading cycles. This represents a 20% chance. In some embodiments more sophisticated calculations may be made including, for example, calculations employing Laplace Smoothing.

The DI node represents the probability the damage index DI will take on a particular value given a crack length of a known size.

Figure 18:
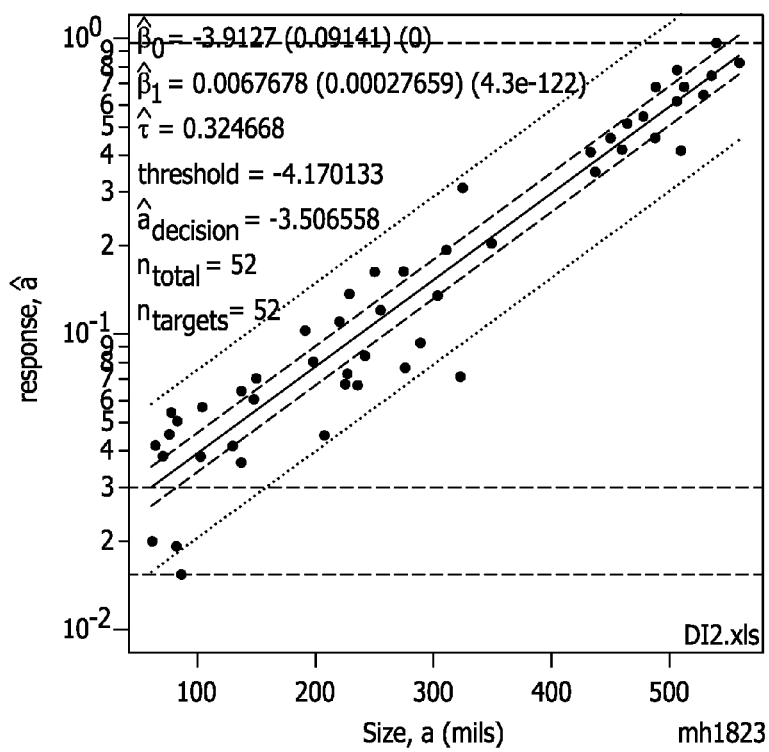
FIG. 18 is a graph illustrating how the probability of a DI value given a particular crack length can be estimated.
Figure 19:
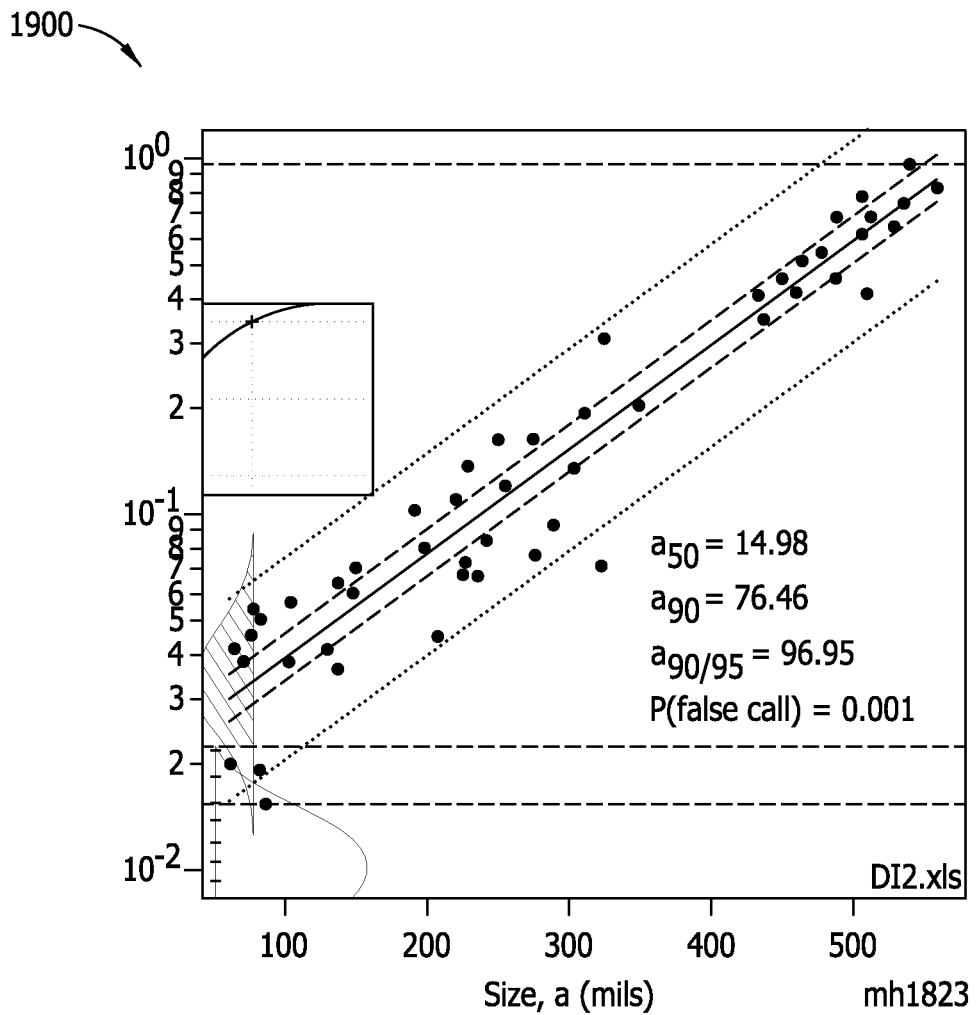
FIG. 19 is a graph of standard error represented by a Gaussian shape for use as part of the method shown in FIG. 1.

FIG. 18 is a graph 1800 that illustrates how the probability of a DI value given a particular crack length can be estimated. Graph 1800 includes a linear regression line for the exemplary DI (known as "a-hat" or "â") as a function of crack length "a". t-hat is the standard error of regression, which is the sample standard deviation of residuals of the model. FIG. 19 is a graph of the standard error represented by a Gaussian shape. This shape can be used along with the mean value represented by the regression line to provide the probability distribution of a-hat as a function of crack length a. The needed model parameters can be obtained by reading them directly off of a figure similar to FIGS. 18 and 19, or by performing a regression using any suitable software.

Figure 21:
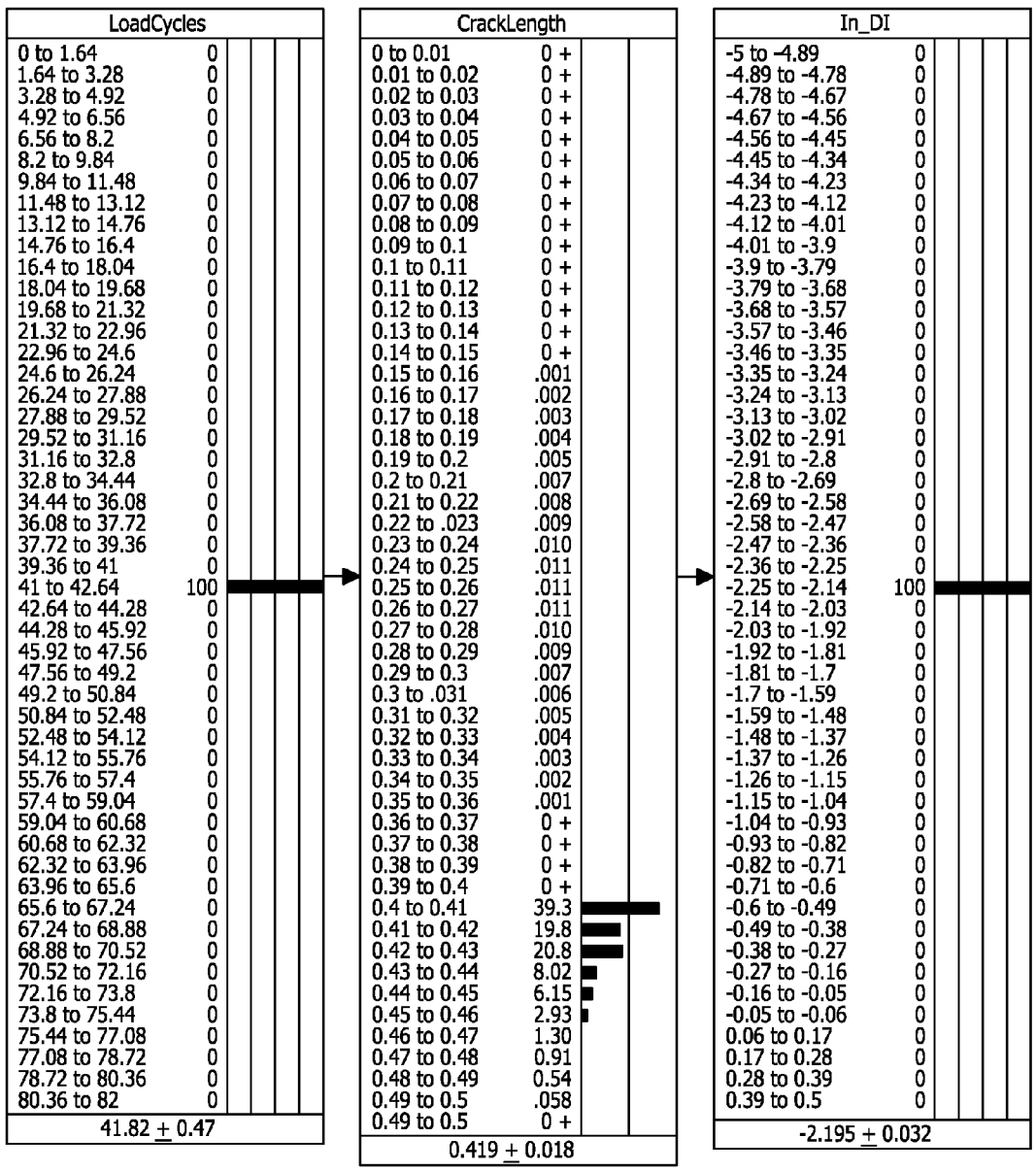
FIG. 21 is a representation of a completed Bayesian network developed as part of the method shown in FIG. 1.

Once the regression has been completed, the CPT can be filled out. For each state of the parent node (load cycle in this case) the mean value of the crack length is estimated using the regression coefficients. This is accomplished by multiplying the slope coefficient by the center value of the state interval and then adding the intercept coefficient. In other embodiments, this is accomplished by sampling the interval and averaging the results. The resulting value will represent the mean value of a Gaussian distribution μ. Next, the standard error of the regression is used as the standard deviation of the Gaussian distribution σ. These two parameters completely specify the Gaussian distribution. Finally, the standard normal cumulative distribution function is used to calculate the probability of crack length being in each of its states according to:

$$\Phi\left[\frac{CrackLength_{MAX} - u}{\sigma}\right] - \Phi\left[\frac{CrackLength_{MIN} - u}{\sigma}\right] \quad (9)$$

where μ=the output of the regression equation, σ=the standard error of the regression equation, CrackLengthMAX=the high value of the crack length interval of interest, and CrackLengthMIN=The low value of the crack length interval of interest. The final result of this process for the exemplary embodiment is shown in FIG. 20. Once the Bayesian network has been completed, entering the known number of load cycles the part has been subjected to as well as the natural log of chosen DI provides a much more certain estimate of the crack length than is possible with either variable alone as shown in FIG. 21.

Figure 22:
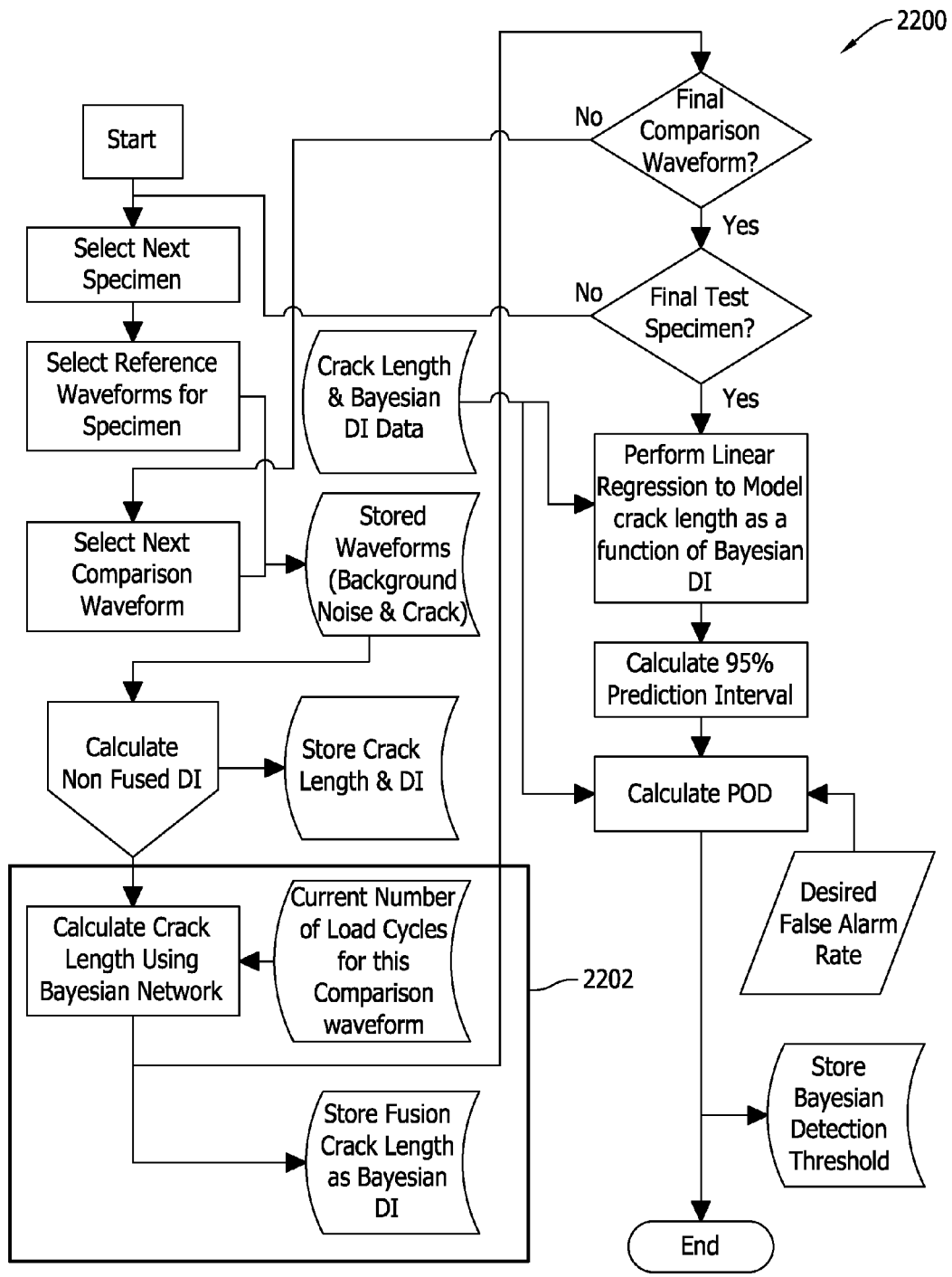
FIG. 22 is a flow diagram of a method for evaluating the output of the 'Crack Length' node.

The output of the 'Crack Length' node can itself be used a DI and can be evaluated using a modified process to that described with respect to FIG. 6, just as any other DI can be used and evaluated. This process is shown in the flowchart 2200 in FIG. 22. The area 2202 shows how the developed Bayesian network is inserted into the evaluation process originally showed in FIG. 6. After the conventional DI has been calculated, its value, along with the current number of load cycles is used as input the Bayesian network and its expected value for the crack length is output and stored as the 'Bayesian DI'

After the SHM system has been developed as described above, including hardware selection, reference waveforms, DI selection, a Bayesian data fusion network DI and Bayesian detection threshold, the completed SHM system can be used to detect cracks.

Figure 23:
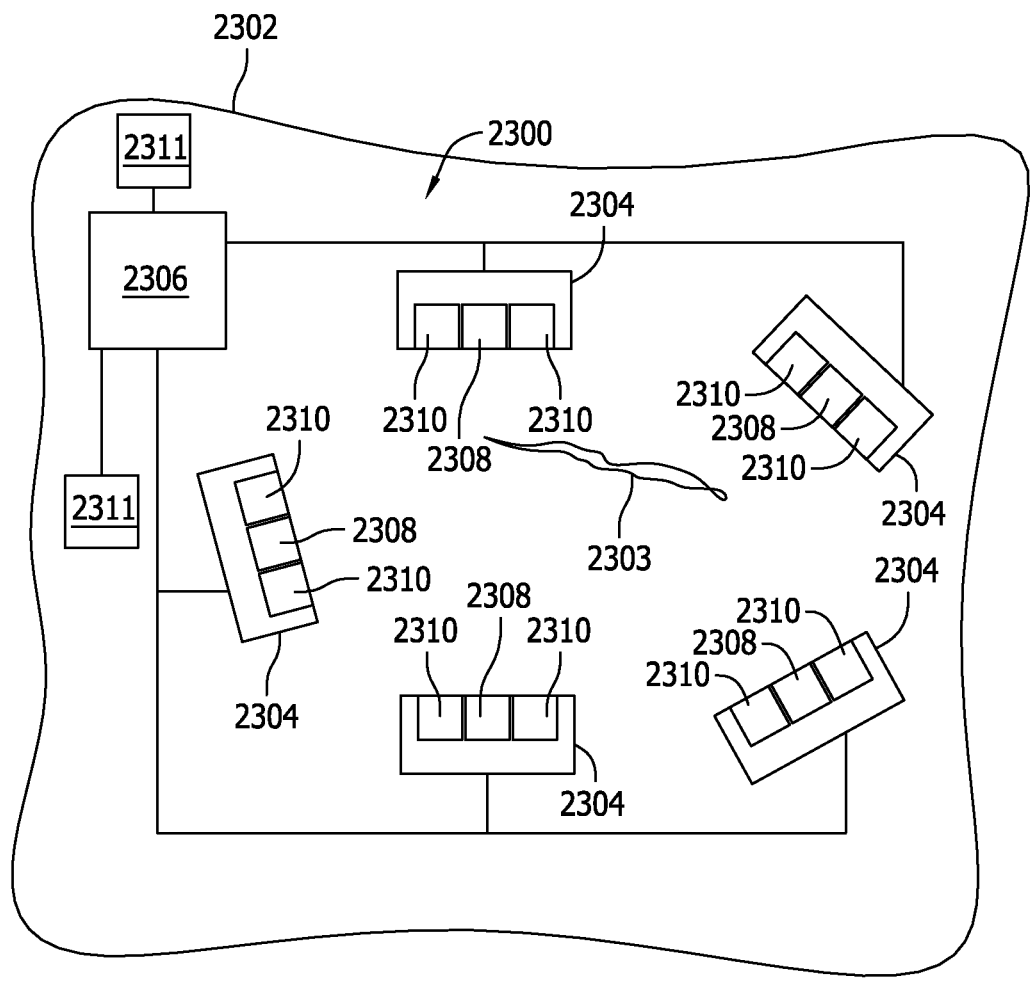
FIG. 23 is a simplified diagram of an exemplary SHM system deployed on a structure.

FIG. 23 is a simplified diagram of an exemplary SHM system 2300 deployed on a structure 2302. Exemplary system 2300 includes combined transducer assemblies 2304 physically coupled to structure 2302 (having a crack 2303) and communicatively coupled to a controller 2306. In some embodiments transducer assemblies 2304 are transducers 200 (shown in FIG. 2) described above. Transducer assemblies 2304 include an actuator 2308 configured to propagate vibrational signal through structure 2302 and sensors 2310 to receive the signal propagated through structure 2302. Other embodiments may include more or fewer transducer assemblies 2304 and/or may include actuators 2308 and sensors 2310 that are not assembled together into an assembly 2304. Moreover, transducer assemblies 2304 may include any suitable number of actuators 2308 and sensors 2310. Exemplary system 2300 includes one or more additional sensors 2311. Additional sensors 2311 are each configured to monitor one or more environmental and/or aging factors. For example, additional sensor 2311 may include a strain gage to monitor the loading (e.g., strain) experienced by structure 2302, may be a temperature sensor, etc. In the exemplary embodiment, assemblies 2304 and sensors 2311 are coupled to controller 2306 by a wired connection. In other embodiments, assemblies 2304 and/or additional sensors 2311 are coupled to controller 2306 by any other suitable communicative coupling including, for example, by a wireless communication connection.

Controller 2306 is configured (e.g., programmed, designed, etc.) to operate SHM system 2300 as described herein. Generally, controller 2306 causes actuators 2308 to propagate a signal through structure 2302 and samples the signals detected by sensors 2310 in response to the propagated signal. Controller 2306 then determines if damage (such as crack 2303) has been detected, determines one or more characteristics of the damage (such as the length of crack 2303), and/or determines a prediction interval. Controller 2306 the outputs the results of its determination(s). The results may be provided in any suitable manner. For example, controller 2306 may display the results visually on an attached display device (not shown), may transmit the results to a remote computing device (not shown), etc. In some embodiments, controller 2306 is an integral component of SHM system 2300 that remains coupled to structure 2302 and transducer assemblies 2304. In other embodiments, controller 2306 is removably coupled to transducer assemblies 2304 and/or structure 2302, thus permitting controller to be attached to transducers 2304 only when system 2300 is to be operated to test structure 2302 for damage.

Figure 24:
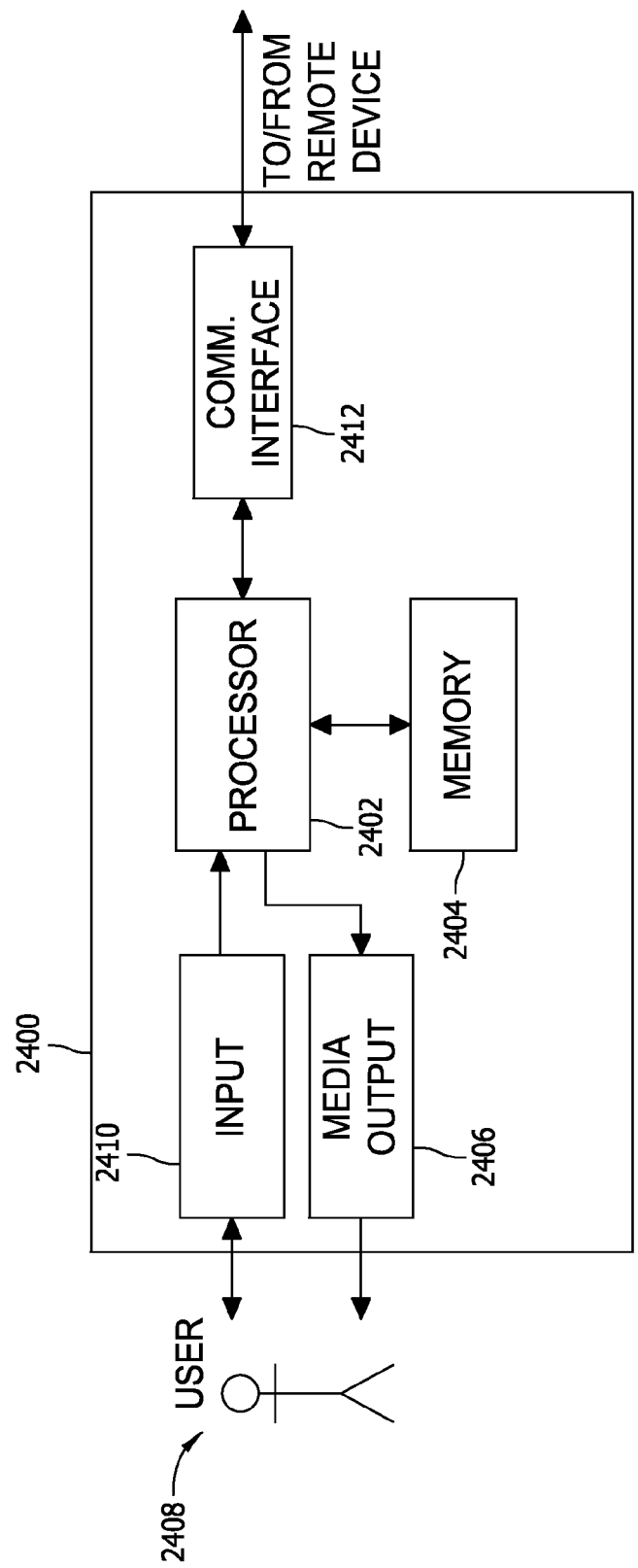
FIG. 24 is an exemplary computing device 2400.

FIG. 24 illustrates an exemplary configuration of a computing device 2400. In some embodiments, controller 2306 (shown in FIG. 23) includes computing device 2400. In some embodiments, one or more steps of the methods of designing a SHM system are performed by one or more computing device 2400. Computing device 2400 includes a processor 2402 for executing instructions. In some embodiments, executable instructions are stored in a memory area 2404. Processor 2402 may include one or more processing units (e.g., in a multi-core configuration). Memory area 2404 is any device allowing information such as executable instructions and/or other data to be stored and retrieved. Memory area 2404 may include one or more computer readable media. In the exemplary embodiment, computer readable instructions to permit remote computing device 2400 to operate as described herein are stored in memory area 2404.

Computing device 2400 also includes at least one media output component 2406 for presenting information to a user 2408. Media output component 2406 is any component capable of conveying information to user 2408. In some embodiments, media output component 2408 includes an output adapter such as a video adapter and/or an audio adapter. An output adapter is operatively coupled to processor 2402 and operatively couplable to an output device such as a display device (e.g., a liquid crystal display (LCD), organic light emitting diode (OLED) display, cathode ray tube (CRT), or "electronic ink" display) and/or an audio output device (e.g., a speaker or headphones).

In some embodiments, computing device 2400 includes an input device 2410 for receiving input from user 2408. Input device 2410 may include, for example, a keyboard, a scanner, a pointing device, a mouse, a stylus, a touch sensitive panel (e.g., a touch pad or a touch screen), a gyroscope, an accelerometer, a position detector, camera, or an audio input device. A single component such as a touch screen may function as both an output device of media output component 2406 and input device 2410. Moreover, in some embodiments, computing device 2400 includes more than one input device 2410 for receiving input from user 2408. For example, computer device may include a keyboard, a touch sensitive panel, and a scanner.

Computing device 2400 includes a communication interface 2412, which is communicatively couplable to a remote device, such as a supervisory computer device, a remote monitoring device, etc. Communication interface 2412 may include, for example, a wired or wireless network adapter or a wireless data transceiver for use with a mobile phone network (e.g., Global System for Mobile communications (GSM), Code Division Multiple Access (CDMA), 3G, 4G or Bluetooth) or other mobile data network (e.g., Worldwide Interoperability for Microwave Access (WIMAX)).

Figure 25:
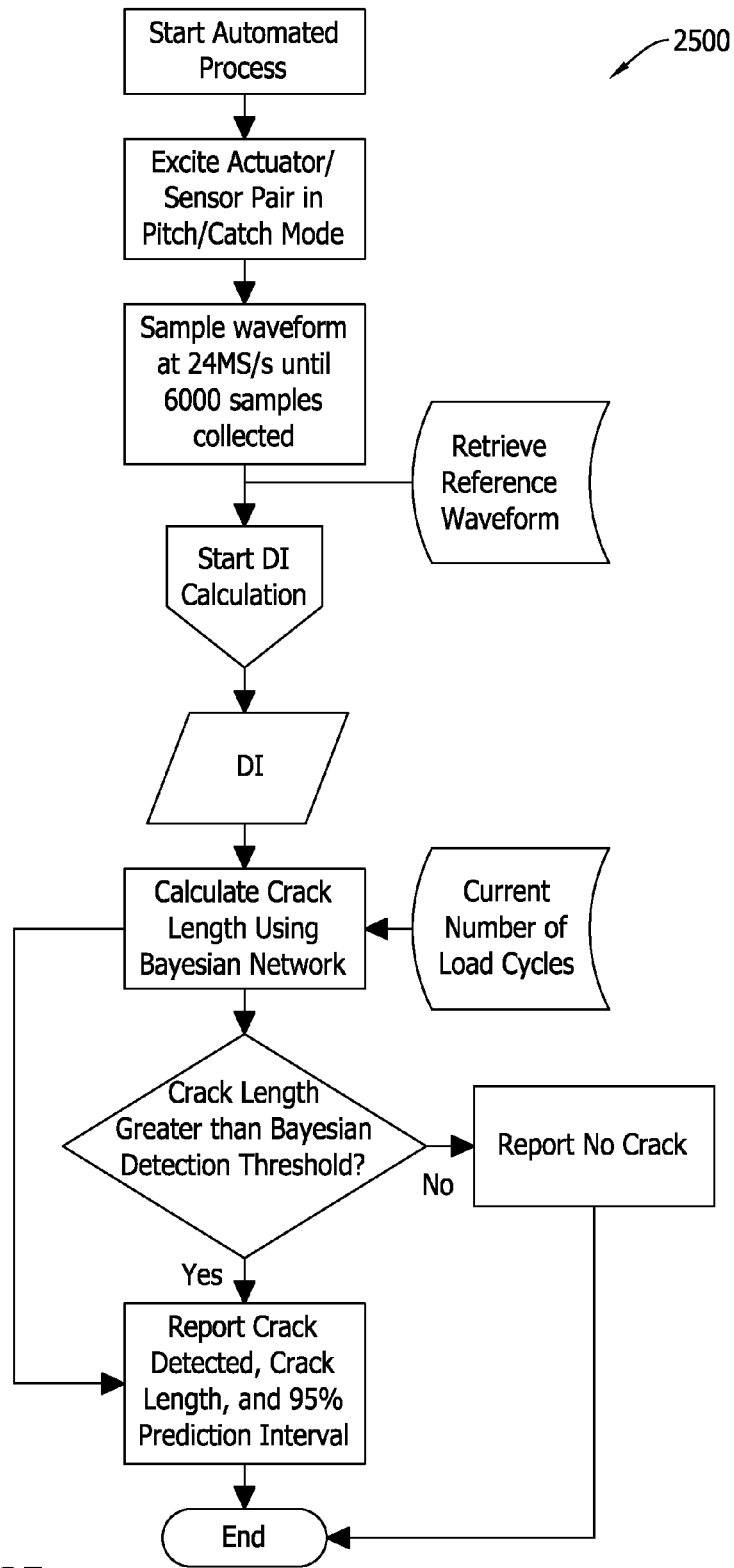
FIG. 25 is a flowchart of an exemplary method for using a SHM system.

A method 2400 for using a SHM system developed as described herein, such as SHM system 2300, is shown in the flowchart of FIG. 25. First, the system 2300 is triggered. This can be accomplished, for example, manually with a button push (not shown), automatically based on a schedule, or automatically if certain conditions are met. In the exemplary embodiment, upon activation, controller 2306 excites actuators 2308 with an excitation signal and samples the output of the sensors 2310 at 24 megasamples per second (MS/s) until 6000 samples are collected. This collected data is used as a comparison waveform. The comparison waveform, along with the stored reference signal is used by controller 2306 to calculate the standard DI. The standard DI, along with the number of load cycles on the structure (possibly as measured by one or more strain gages 2311) are input to the Bayesian network. The Bayesian network then outputs the expected crack length value. If this value is greater than the Bayesian detection threshold, system 2300 reports that a crack has been detected, its estimated length, and the 95% prediction interval for that length.

The exemplary methods and systems described provide a step by step process for designing SHM systems for any given piece of structural hardware, a rigorous process for evaluating a given SHM system, a method to quantify the performance of a given SHM system in comparison to current inspection processes, a finite element modeling approach to determining excitation frequencies to detect damage and for selecting the best time window to use for sensed excitation signals, a Bayesian Network based data fusion technique that fuses in environmental information (load cycles induced on the structure) with a damage index (DI) to produce crack detection and estimation of crack length better than either source of information can produce alone, a new damage location and sensor selection technique, and/or an exemplar system designed by this process. The methods and systems described herein provide an on-board SHM system that is operable to detect a crack within a specified region within an aircraft structure, locate the crack within that region, and indicate the length of the crack. Some embodiments of this disclosure describe a prescribed series of steps needed to turn raw vibration data collected under realistic conditions into a reliable and consistent detection of cracks with a relatively low false alarm rate. This process includes hardware configuration, signal excitation frequencies, signal processing, damage index calculation, side selection, data fusion and crack length estimation.

The description of the different advantageous embodiments has been presented for purposes of illustration and description, and is not intended to be exhaustive or limited to the embodiments in the form disclosed. Many modifications and variations will be apparent to those of ordinary skill in the art. Further, different advantageous embodiments may provide different advantages as compared to other advantageous embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated. This written description uses examples to disclose various embodiments, which include the best mode, to enable any person skilled in the art to practice those embodiments, including making and using any devices or systems and performing any incorporated methods. The patentable scope is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method for measuring structural health on hot spots of an aircraft structure using a series of adjacently located actuators in the aircraft structure including at least one group, the method comprising:
   generating, using the at least one group of the series of adjacently located actuators in the aircraft structure, a vibration in the aircraft structure;
   collecting, by a plurality of sensors disposed in one or more testing areas of the aircraft structure, the vibration produced by the at least one group of the series of adjacently located actuators, the plurality of sensors locally disposed in one or more testing areas of the aircraft structure;
   comparing, by a controller, the vibration collected by each sensor of the plurality of sensors to a reference signal for the at least one group of the series of adjacently located actuators;
   generating a summation of damage indexes for the at least one group of the series of adjacently located actuators; and
   using Bayesian network based data fusion of environmental information fused with the damage indexes from the at least one group of the series of adjacently located actuators to estimate a crack length in the aircraft structure based on a return signal response.

2. The method of claim 1, further comprising using center of mass calculations for the aircraft structure to determine a location of one or more damaged areas or sections that require repair of the aircraft structure.

3. A SHM system in accordance with claim 2, wherein said controller is further configured to output an indication that damage has occurred, the expected value of the damage characteristic, and the ninety-five percent prediction interval when the expected value of the damage characteristic exceeds the damage threshold.

4. The method of claim 1, further comprising using Bayesian network based data fusion of load cycles induced on the aircraft structure fused with the damage indexes from the at least one group of the series of adjacently located actuators to estimate a crack length in the aircraft structure based on a return signal response.

5. The method of claim 4, further comprising measuring, storing, and comparing the crack length periodically and recording the damage index associated with the crack length.

6. The method of claim 1, further comprising receiving, by the controller, an indication of a value of an aging factor of the aircraft structure from at least one aging factor sensor.

7. A structural health monitoring (SHM) system for use in monitoring a host structure that may be susceptible to damage, the damage having a damage characteristic influenced, at least in part, by an aging factor, said SHM system comprising:
   at least one actuator configured to couple to the host structure and propagate a vibration signal through the host structure;
   at least one sensor configured to couple to the host structure, detect the vibration signal propagated through the host structure by said at least one actuator, and generate at least one signal in response to the vibration signal propagated through the host structure by said at least one actuator; and
   a controller coupled to said at least one actuator and said at least one sensor, said controller configured to:
      control said at least one actuator to propagate the vibration signal through the host structure;
      receive the at least one vibration signal from said at least one sensor;

calculate a damage index (DI) based, at least in part, on the at least one signal;

input the calculated DI to a Bayesian network configured to output an expected value of the damage characteristic; and determine a ninety-five percent prediction interval for the expected value of the damage characteristic when the expected value of the damage characteristic exceeds a damage threshold.

8. A SHM system in accordance with claim 7, further comprising at least one aging factor sensor coupled to the controller and configured to provide an indication of a value of the aging factor to said controller.

9. A SHM system in accordance with claim 8, wherein said controller is configured to input the calculated DI and the value of the aging factor to the Bayesian network configured to output the expected value of the damage characteristic.

10. A SHM system in accordance with claim 7, wherein said controller is configured to use center of mass calculations for the aircraft structure to determine a location of one or more damaged areas or sections that require repair of the aircraft structure.

11. A SHM system in accordance with claim 7, wherein said controller is configured to measure, store, and compare the damage characteristic periodically and recording the DI associated with the damage characteristic.

12. A SHM system in accordance with claim 7, wherein said controller is configured to output an indication that damage has occurred, the expected value of the damage characteristic, and the ninety-five percent prediction interval when the expected value of the damage characteristic exceeds the damage threshold.

13. A method for measuring structural health on hot spots of an aircraft structure using a series of adjacently located actuators in the aircraft structure including at least one group, the method comprising:

generating, using the at least one group of the series of adjacently located actuators in the aircraft structure, a vibration in the aircraft structure;

collecting, by a plurality of sensors disposed in one or more testing areas of the aircraft structure, the vibration produced by the at least one group of the series of adjacently located actuators, the plurality of sensors locally disposed in one or more testing areas of the aircraft structure;

comparing, by a controller, the vibration collected by each sensor of the plurality of sensors to a reference signal for the at least one group of the series of adjacently located actuators;

generating a summation of damage indexes for the at least one group of the series of adjacently located actuators; and using Bayesian network based data fusion of load cycles induced on the aircraft structure fused with the damage indexes from the at least one group of the series of adjacently located actuators to estimate a crack length in the aircraft structure based on a return signal response.

14. The method of claim 13, further comprising measuring, storing, and comparing the crack length periodically and recording the damage index associated with the crack length.

15. The method of claim 13, further comprising using center of mass calculations for the aircraft structure to determine a location of one or more damaged areas or sections that require repair of the aircraft structure.

16. The method of claim 13, further comprising determining, by the controller, whether the estimated crack length exceeds a damage threshold.

17. The method of claim 16, further comprising determining, by the controller, a ninety-five percent prediction interval for the estimate of the crack length when the estimated crack length exceeds the damage threshold.

18. The method of claim 17, further comprising outputting, by the controller, an indication that damage has occurred, the estimated crack length, and the ninety-five percent prediction interval when the estimated crack length exceeds the damage threshold.

19. The method of claim 13, further comprising receiving, by the controller, an indication of a value of an aging factor of the aircraft structure from at least one aging factor sensor.

20. The method of claim 19, wherein using Bayesian network based data fusion of load cycles induced on the aircraft structure fused with the damage indexes from the at least one group of the series of adjacently located actuators to estimate a crack length in the aircraft structure based on a return signal response comprises using Bayesian network based data fusion of load cycles induced on the aircraft structure fused with the damage indexes from the at least one group of the series of adjacently located actuators and the indication of the value of the aging factor to estimate a crack length in the aircraft structure.

* * * * *